United States Patent
Yoo et al.

(10) Patent No.: US 10,629,838 B2
(45) Date of Patent: Apr. 21, 2020

(54) CORE-SHELL NANOWIRE, METHOD FOR SYNTHESIZING THE CORE-SHELL NANOWIRE, AND TRANSPARENT ELECTRODE AND ORGANIC LIGHT EMITTING DIODE INCLUDING THE CORE-SHELL NANOWIRE

(71) Applicant: DUKSAN HI-METAL CO., LTD., Ulsan (KR)

(72) Inventors: Young Zo Yoo, Seoul (KR); Yoon Soo Choi, Gimhae-si (KR); Yeong Jin Lim, Yeosu-si (KR)

(73) Assignee: DUKSAN HI-METAL CO., LTD., Ulsan (KR)

( * ) Notice: Subject to any disclaimer, the term of this patent is extended or adjusted under 35 U.S.C. 154(b) by 31 days.

(21) Appl. No.: 15/546,528

(22) PCT Filed: Jan. 26, 2015

(86) PCT No.: PCT/KR2015/000803
§ 371 (c)(1),
(2) Date: Jul. 26, 2017

(87) PCT Pub. No.: WO2016/122006
PCT Pub. Date: Aug. 4, 2016

(65) Prior Publication Data
US 2018/0026224 A1    Jan. 25, 2018

(51) Int. Cl.
*H01L 51/52* (2006.01)
*B82Y 30/00* (2011.01)
(Continued)

(52) U.S. Cl.
CPC .......... *H01L 51/5206* (2013.01); *B82Y 30/00* (2013.01); *B82Y 40/00* (2013.01);
(Continued)

(58) Field of Classification Search
CPC ..... H01L 51/5206; B82Y 40/00; B82Y 30/00; B82Y 20/00; Y10S 977/81;
(Continued)

(56) References Cited

U.S. PATENT DOCUMENTS

| | | | |
|---|---|---|---|
| 2013/0075693 A1* | 3/2013 | Svensson | H01L 29/0676 257/13 |
| 2013/0133483 A1* | 5/2013 | Yang | B22F 1/0018 75/351 |

(Continued)

*Primary Examiner* — Cuong B Nguyen
*Assistant Examiner* — Samuel Park
(74) *Attorney, Agent, or Firm* — Conley Rose, P.C.; Rodney B. Carroll

(57) ABSTRACT

A metal nanowire according to an embodiment of the invention includes at least one bent portion. An angle (α) between an n-th wire portion and an (n+1)-th wire portion connected to the n-th wire portion through an n-th bent portion satisfies an inequation of $0°<\alpha<180°$.

Also, a metal nanowire according to another embodiment of the invention includes at least two wire portions. The metal nanowire includes an n-th wire portion and an (n+1)-th wire portion connected to the n-th wire portion. A diameter of the n-th wire portion is different from a diameter of the (n+1)-th wire portion.

In addition, a core-shell nanowire according to yet another embodiment includes a nanowire core; and a metal-compound shell formed on the nanowire core.

A method of manufacturing a metal nanowire according to an embodiment includes preparing a reaction mixture and synthesizing a nanowire. In the preparing the reaction mixture, a metal salt, a reducing solvent for reducing the metal salt to a melt, a capping agent for growing the metal into a shape of a wire, and a catalyst are mixed. In the synthesizing the nanowire, the mixture is added to a reaction container and is reacted in the reaction container at 1 to 5 atm. Then, (Continued)

the nanowire including at least two wire portions and having a bent portion is manufactured.

Also, a method of manufacturing a metal nanowire according to another embodiment includes preparing a reaction mixture and synthesizing a nanowire. In the preparing the reaction mixture, a metal salt, a reducing solvent for reducing the metal salt to a melt, a capping agent for growing the metal into a shape of a wire, and a catalyst are mixed. In the synthesizing the nanowire, the mixture is added to a reaction container and is reacted in the reaction container at 1 to 5 atm. Then, the nanowire having different diameters is manufactured.

In addition, a method of manufacturing a metal nanowire according to yet another embodiment preparing a nanowire core on a substrate; contacting the nanowire core with a precursor solution for forming a metal-compound shell; and forming a metal-compound shell on the nanowire core by supplying growth energy.

A transparent electrode according to an embodiment includes a conductor layer including a metal nanowire; and a transparent electrode layer formed on the conductor layer. The metal nanowire includes at least one bent portion. An angle ($\alpha$) between an n-th wire portion and an (n+1)-th wire portion connected to the n-th wire portion through an n-th bent portion satisfies an inequation of $0°<\alpha<180°$.

Also, a transparent electrode according to another embodiment includes a conductor layer including a metal nanowire; and a transparent electrode layer formed on the conductor layer. The metal nanowire includes at least two wire portions. The metal nanowire includes an n-th wire portion and an (n+1)-th wire portion connected to the n-th wire portion. A diameter of the n-th wire portion is different from a diameter of the (n+1)-th wire portion.

Also, a transparent electrode according to yet another embodiment includes a conductor layer including a core-shell nanowire; and a transparent electrode layer formed on the conductor layer. The core-shell nanowire according to yet another embodiment includes a nanowire core; and a metal-compound shell formed on the nanowire core.

A metal (or core-shell) nanowire and a method for manufacturing the same, and a transparent electrode and an organic light emitting diode including the metal (or core-shell) nanowire having a high electric conductivity, a suitable transmittance and a suitable haze are provided.

28 Claims, 29 Drawing Sheets

(51) Int. Cl.
  *B82Y 40/00* (2011.01)
  *B82Y 20/00* (2011.01)
(52) U.S. Cl.
  CPC ............ *B82Y 20/00* (2013.01); *Y10S 977/762* (2013.01); *Y10S 977/766* (2013.01); *Y10S 977/81* (2013.01); *Y10S 977/892* (2013.01); *Y10S 977/896* (2013.01); *Y10S 977/932* (2013.01)
(58) Field of Classification Search
  CPC ............ Y10S 977/766; Y10S 977/932; Y10S 977/762; Y10S 977/896; Y10S 977/892
  See application file for complete search history.

(56) References Cited

U.S. PATENT DOCUMENTS

| | | | |
|---|---|---|---|
| 2013/0342221 A1* | 12/2013 | Virkar | G06F 3/041 324/661 |
| 2014/0020737 A1* | 1/2014 | Jung | H01B 1/02 136/252 |
| 2015/0359105 A1* | 12/2015 | Yoon | C09D 139/02 174/268 |
| 2017/0154701 A1* | 6/2017 | Lee | B22F 1/02 |

\* cited by examiner

[Fig. 1]
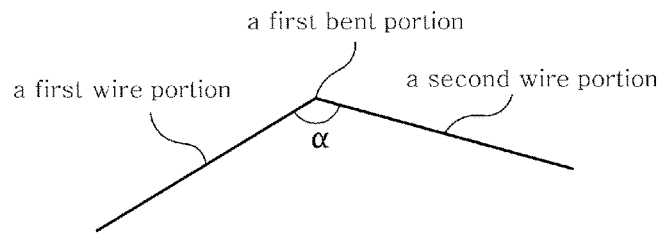
[Fig. 2]
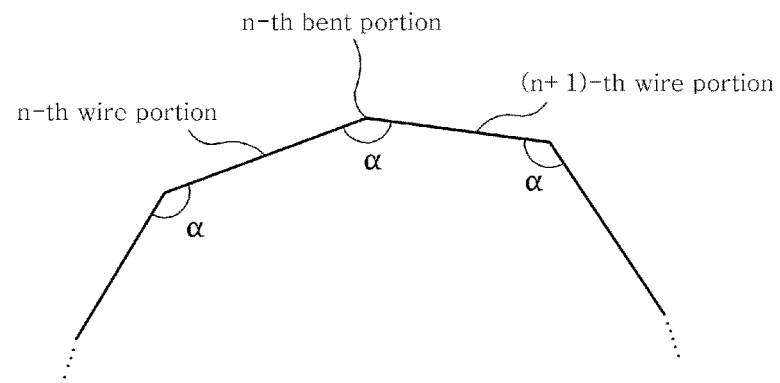
[Fig. 3]
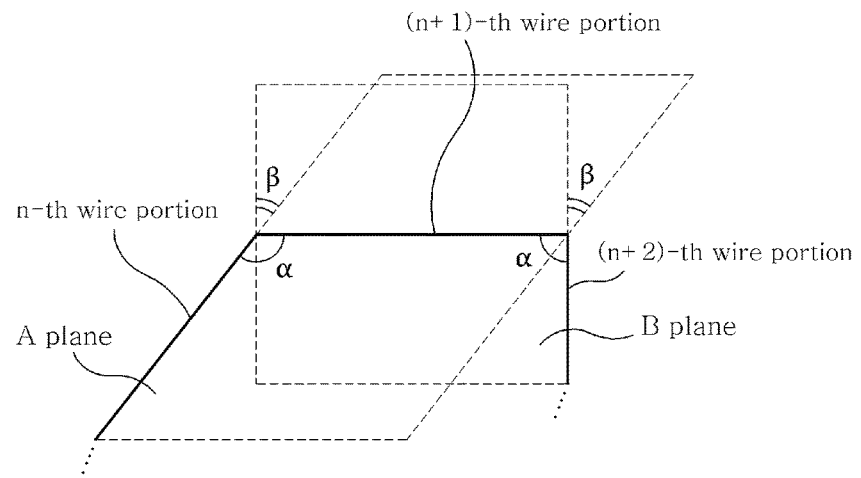
[Fig. 4]
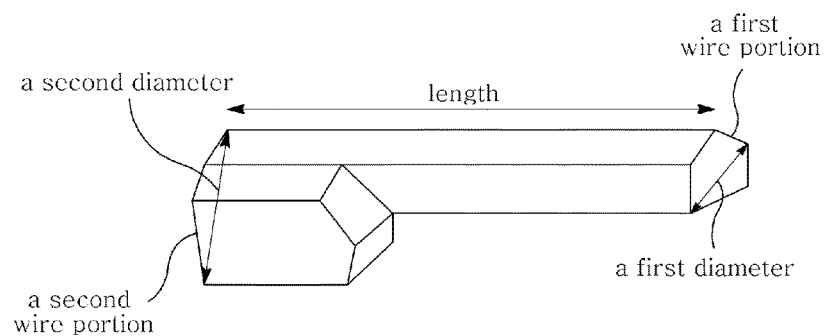

[Fig. 5]
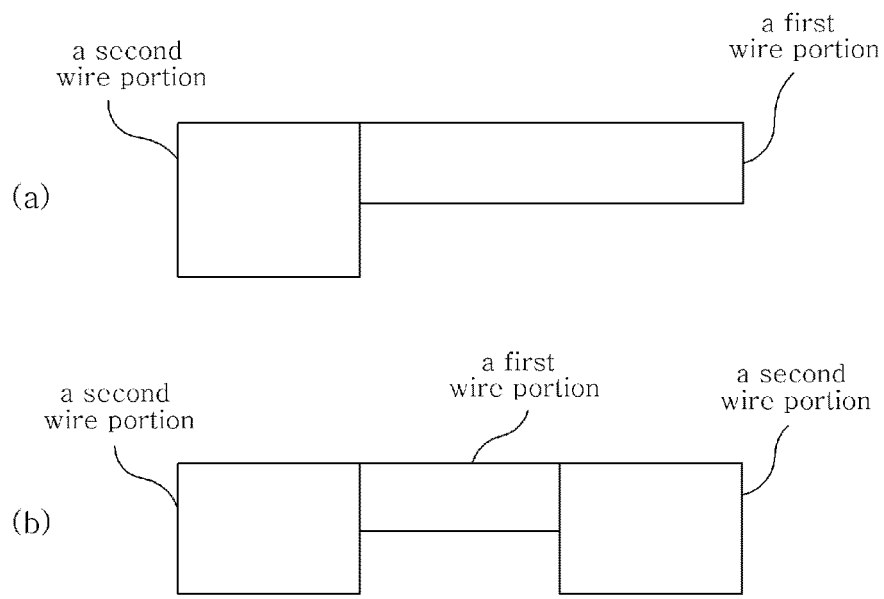
[Fig. 6]
[Fig. 7]
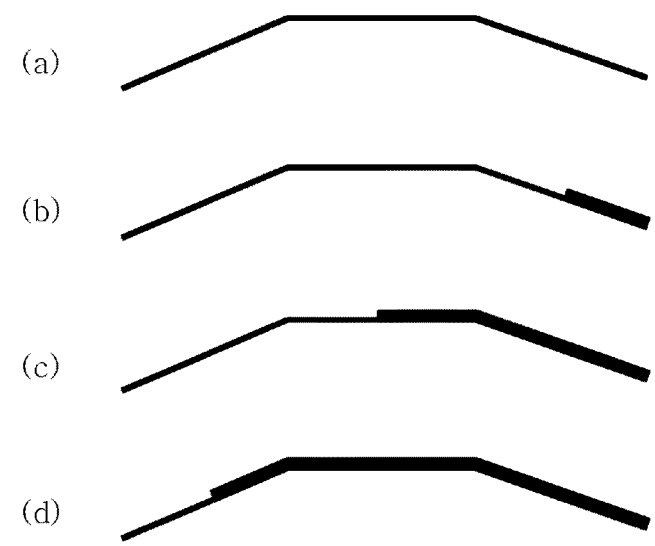

[Fig. 8]
(a) 
(b) 
(c) 
(d) 
[Fig. 9]
(a) 
(b) 
(c) 
(d) 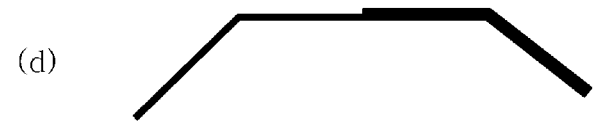

[Fig. 10]
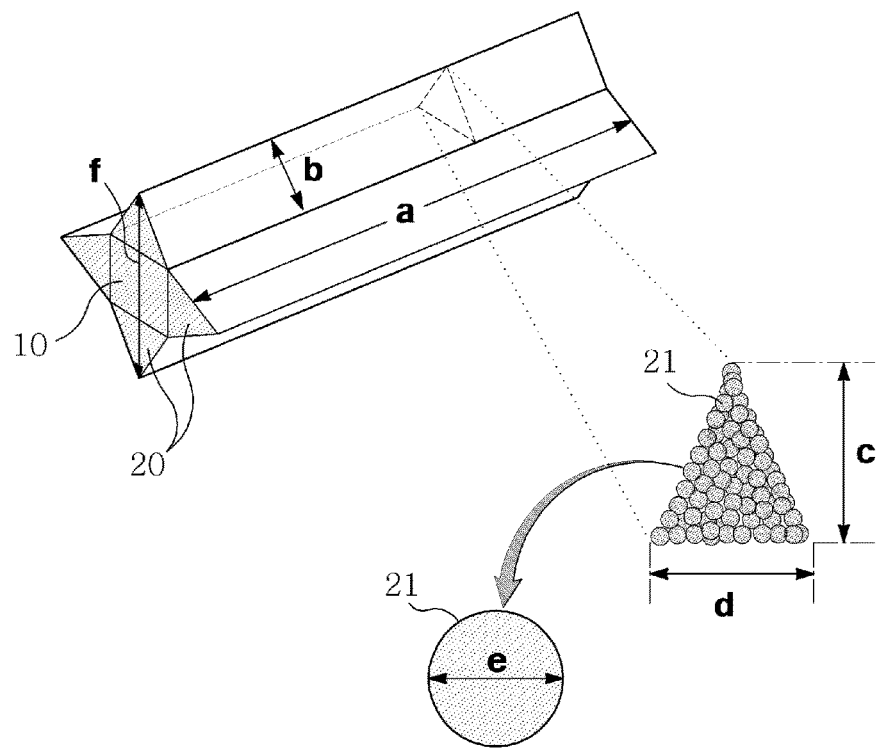
[Fig. 11]
(a)
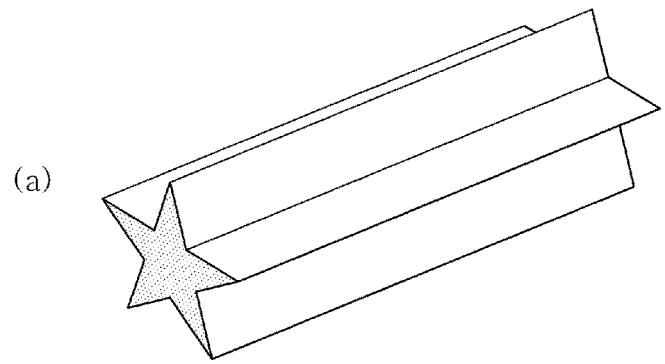
(b)
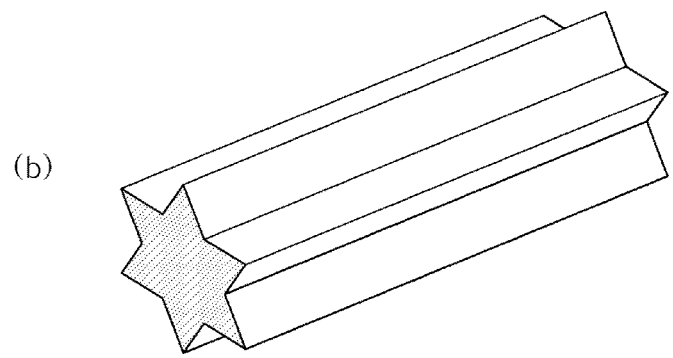

[Fig. 12]
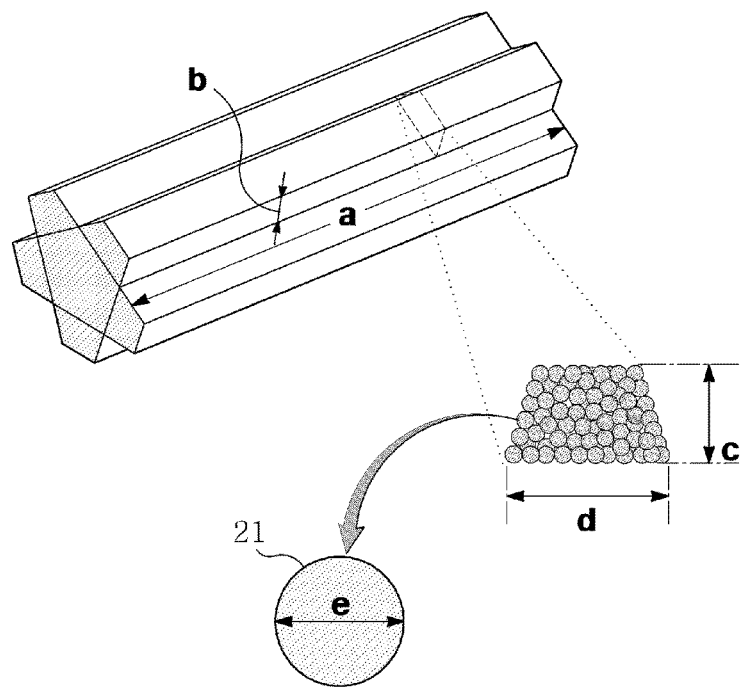
[Fig. 13]
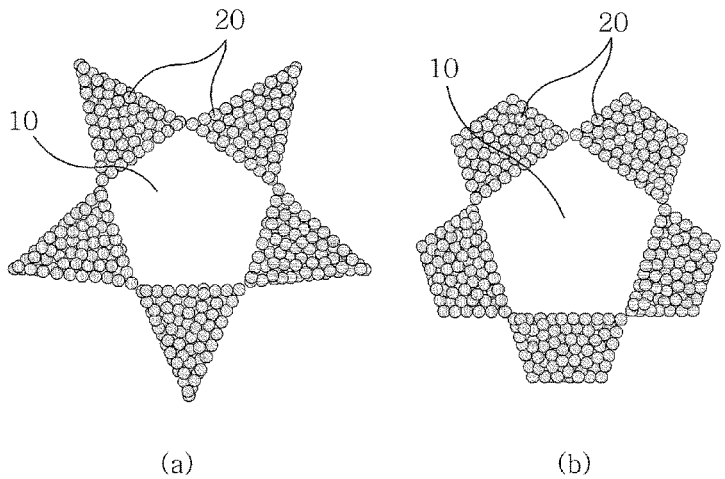
(a)　　　　　(b)
[Fig. 14]
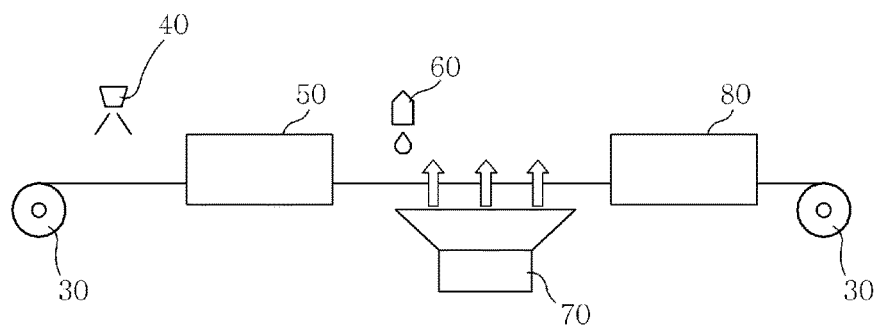

[Fig. 15]
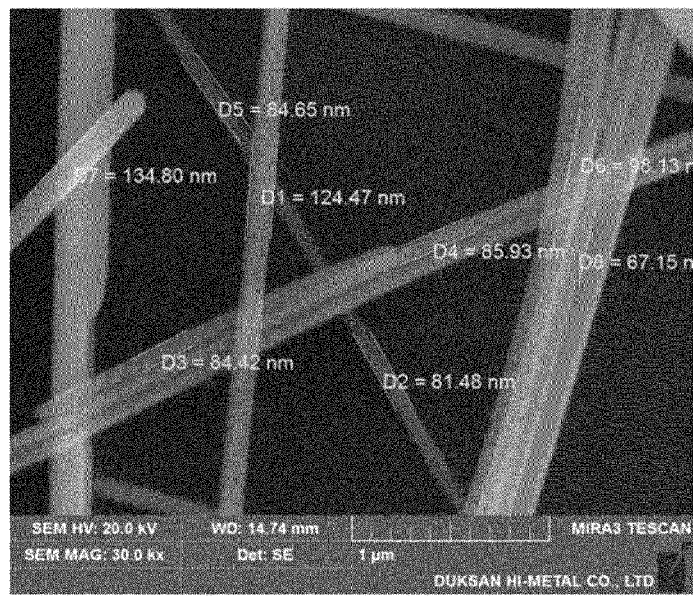
(a)
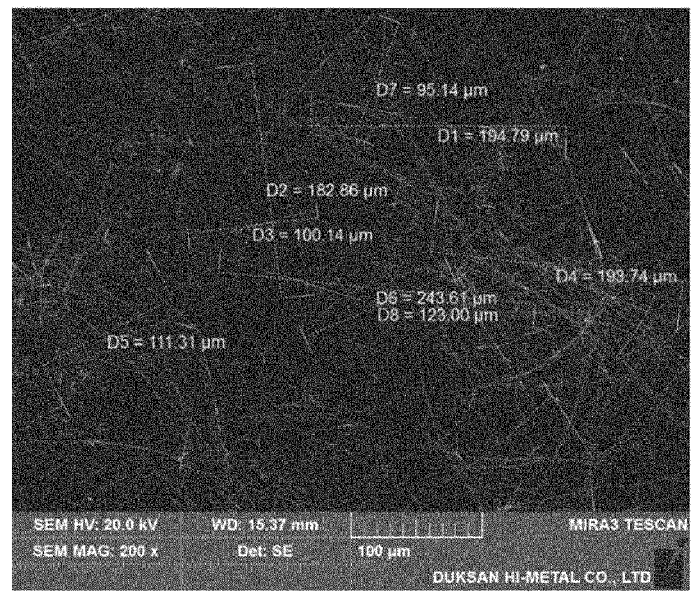
(b)

[Fig. 16]
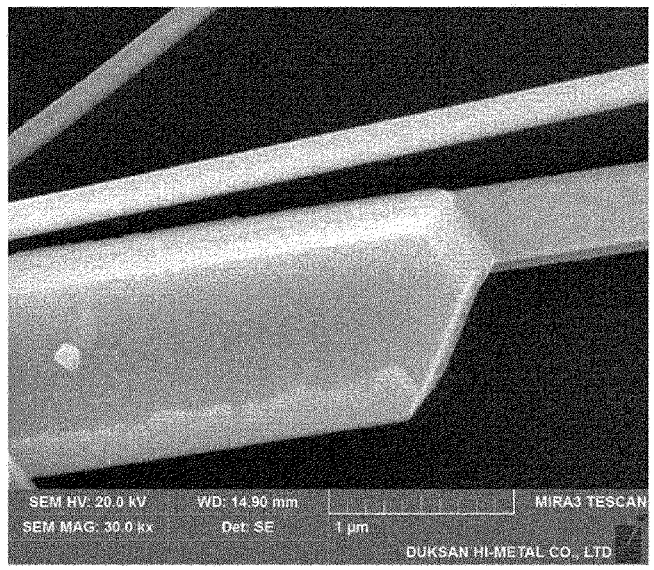
[Fig. 17]
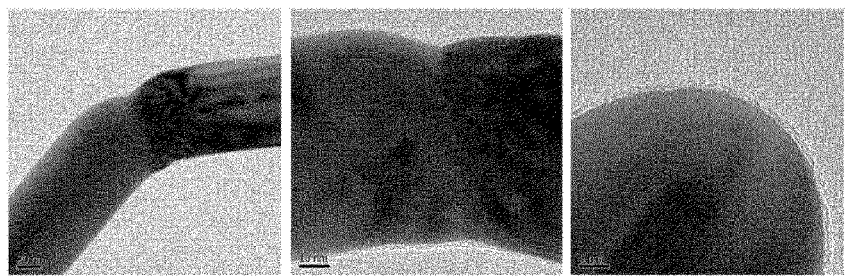
[Fig. 18]
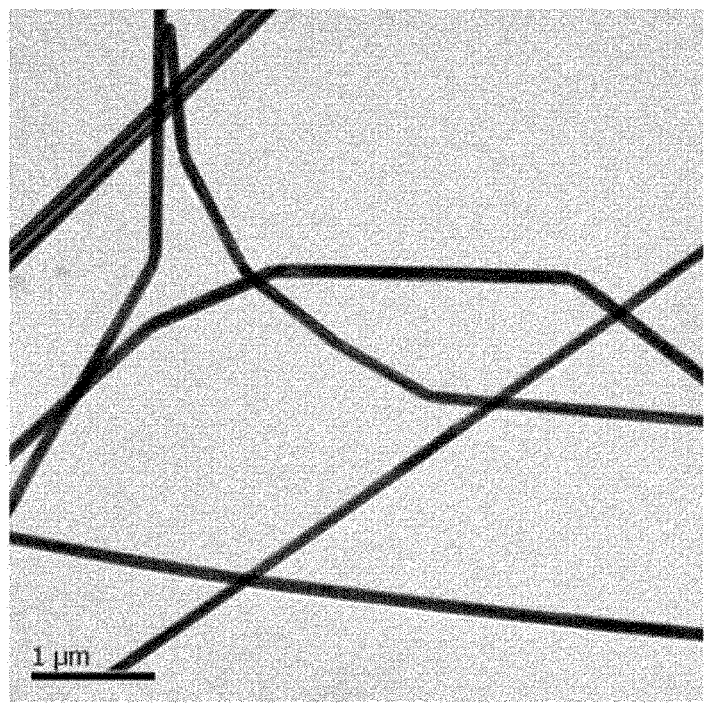

[Fig. 19]
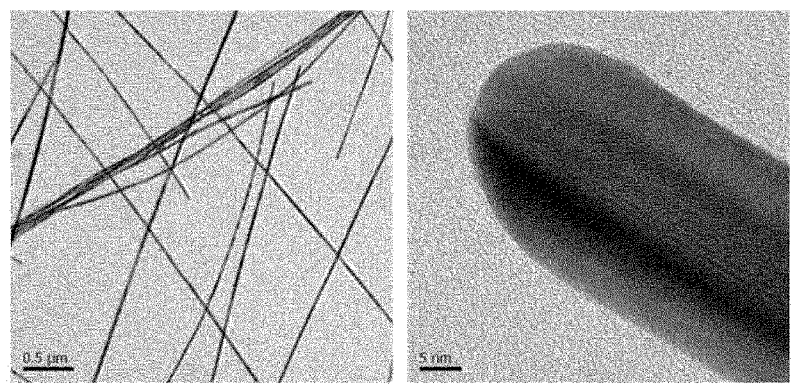
[Fig. 20]
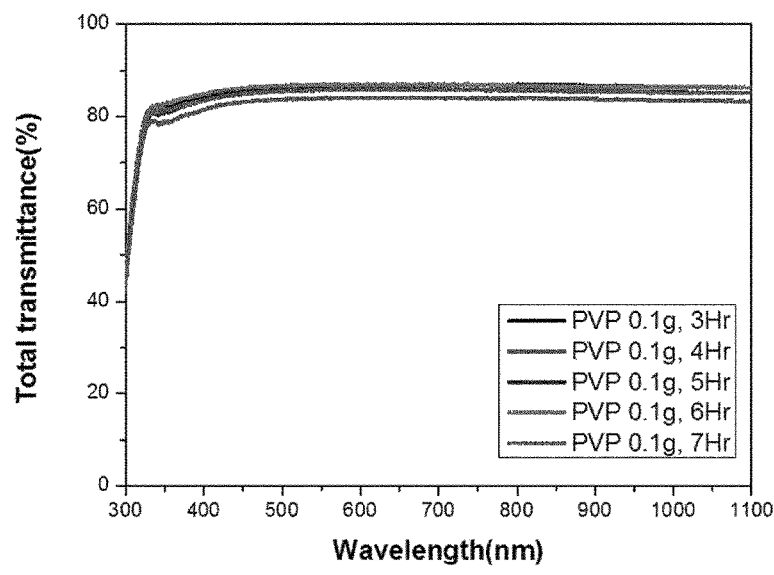
(a)
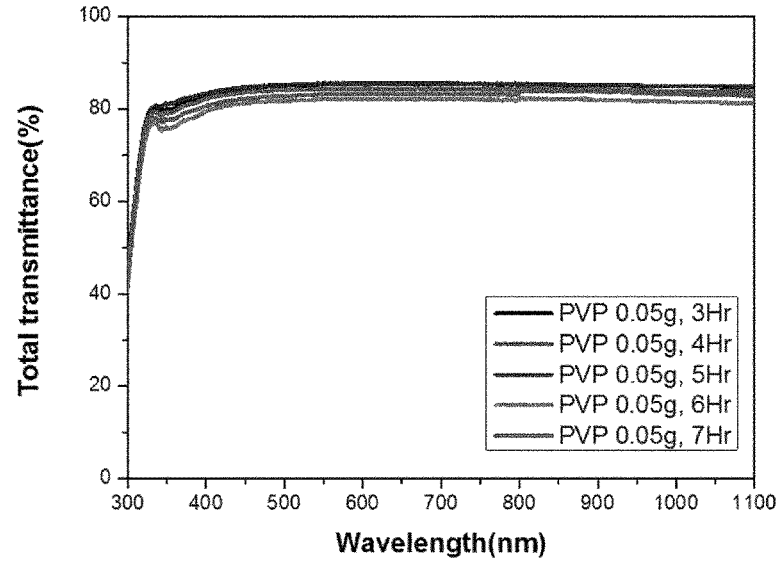
(b)

[Fig. 21]
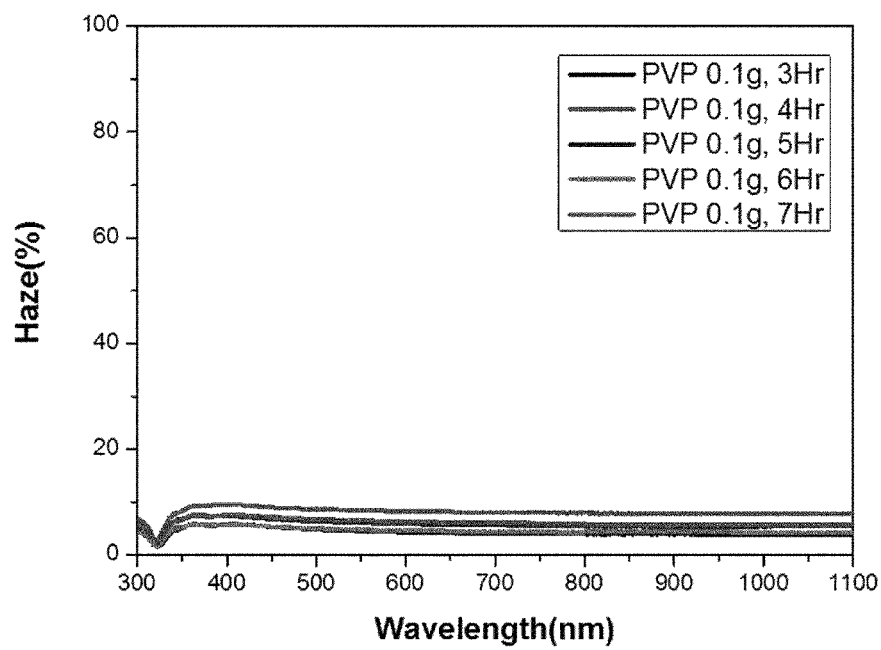
(a)
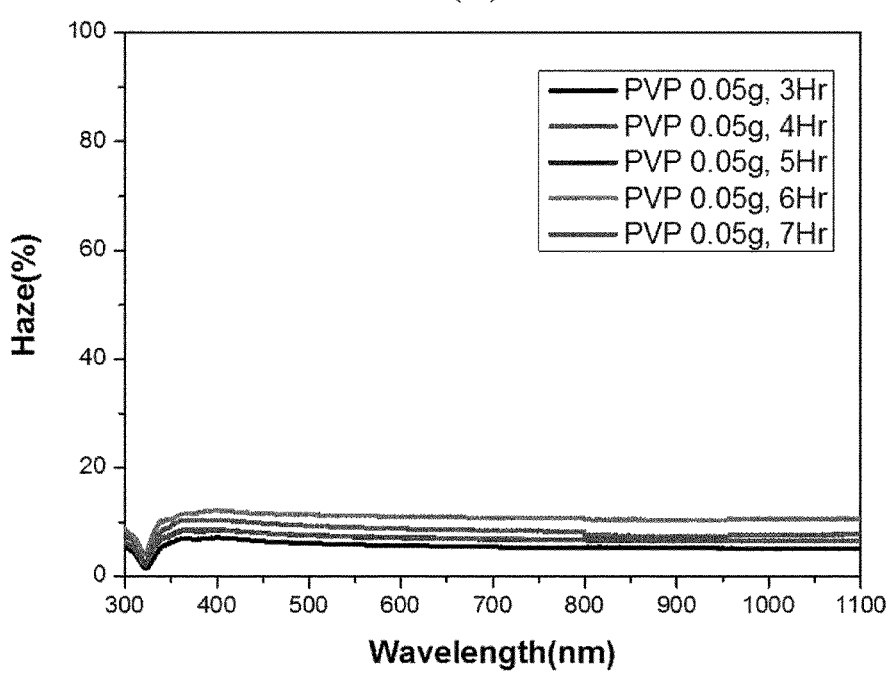
(b)

[Fig. 22]
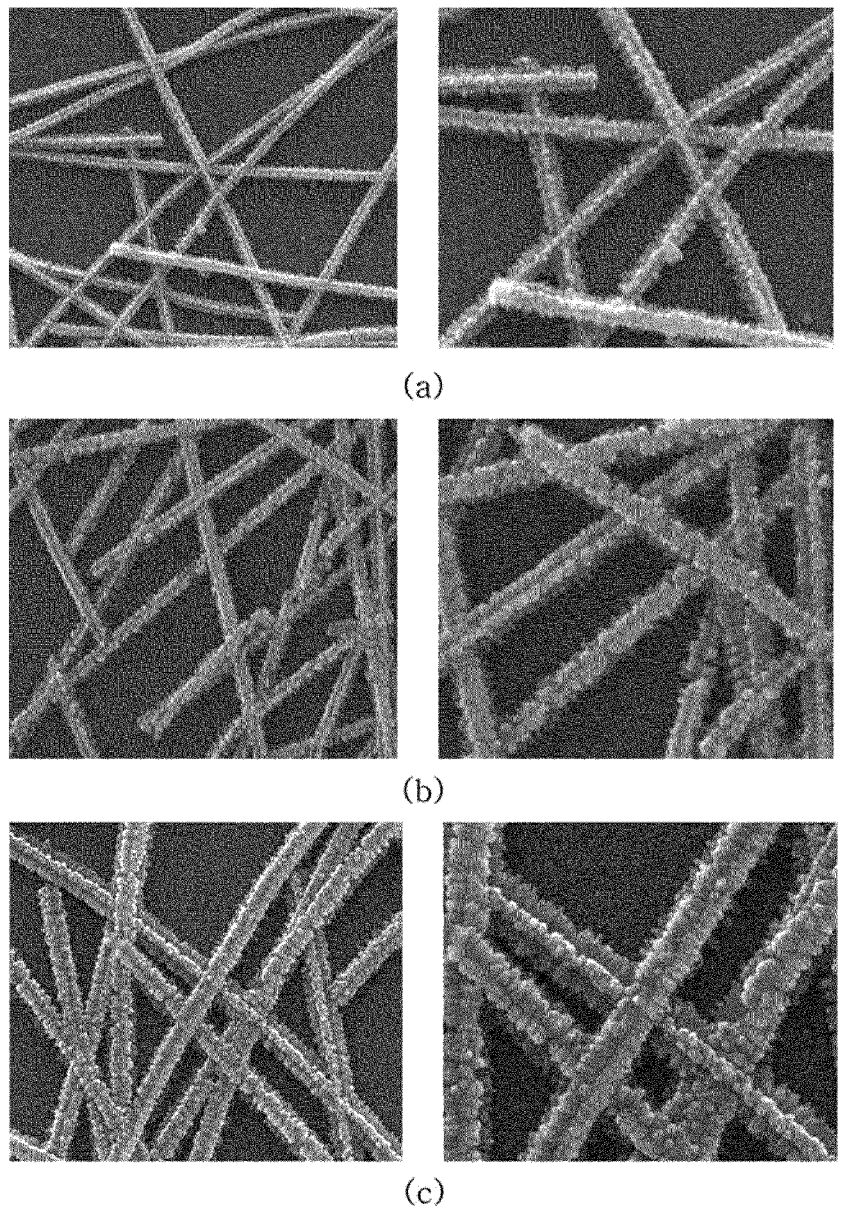
(a)
(b)
(c)

[Fig. 23]
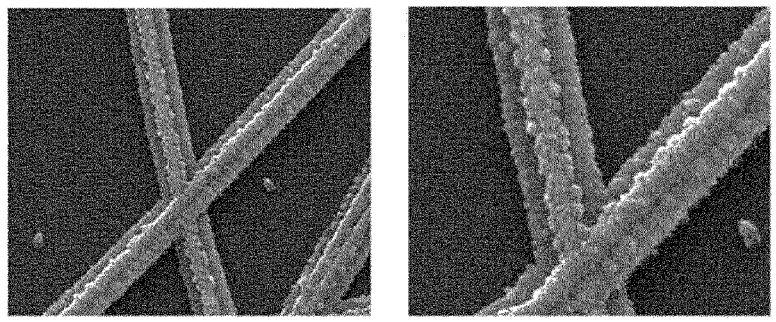
(a)
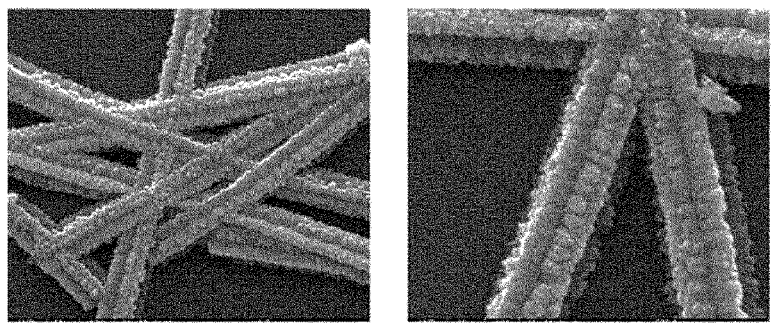
(b)
[Fig. 24]
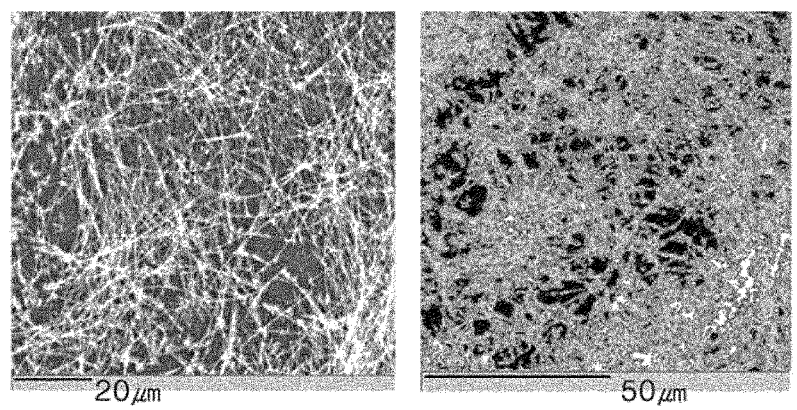
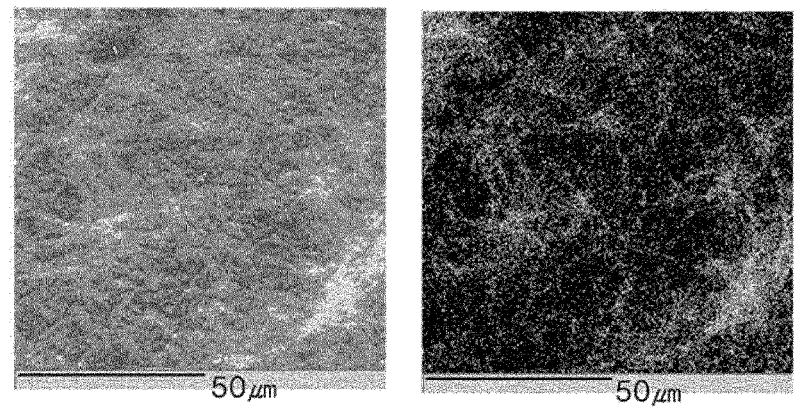

[Fig. 25]
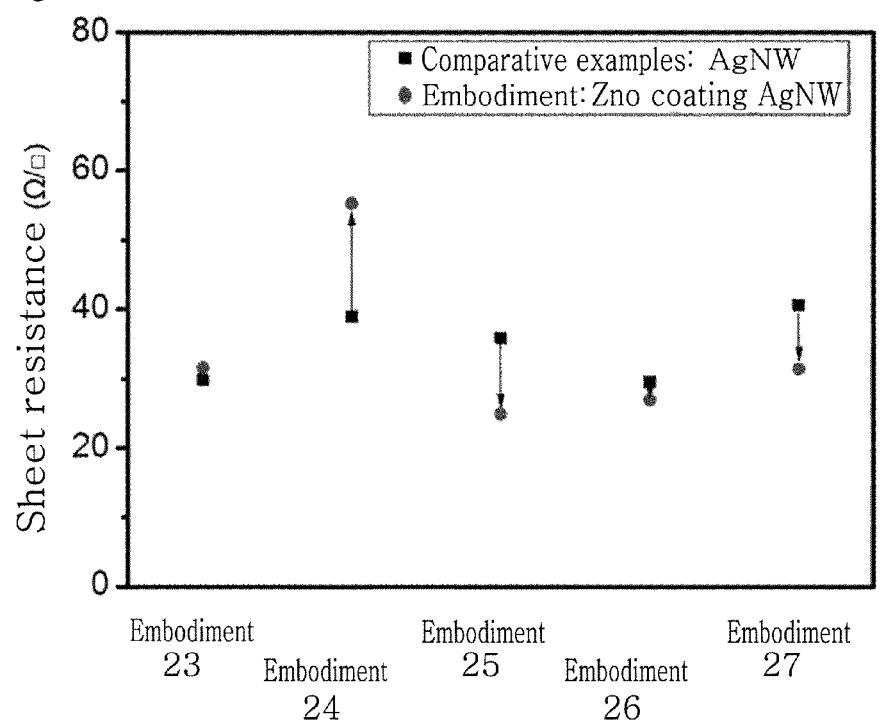

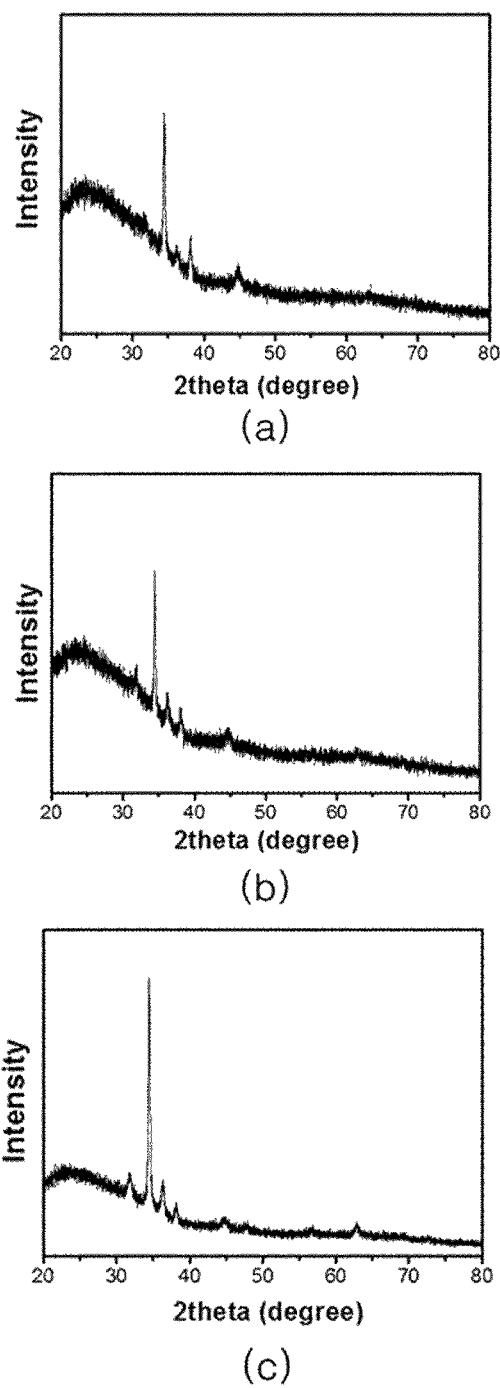
[Fig. 26]

[Fig. 27]
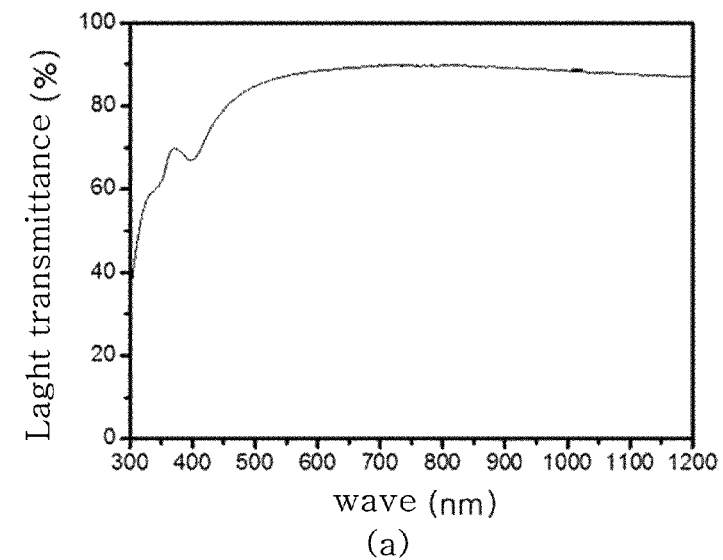
(a)
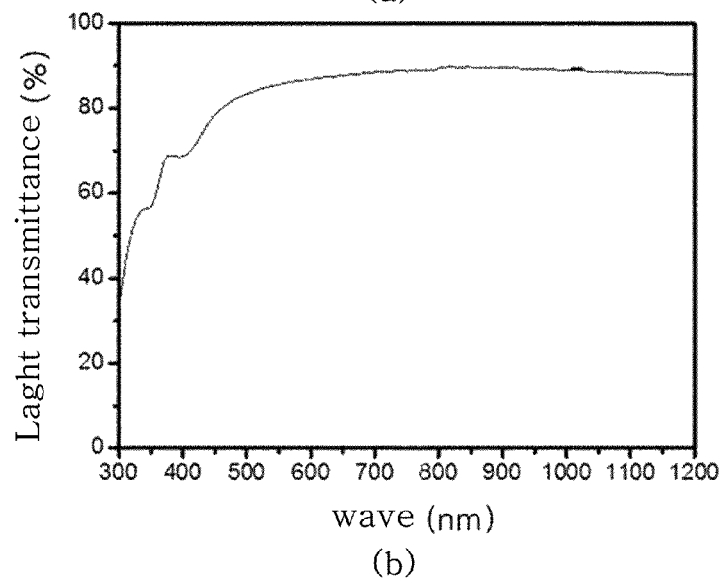
(b)

[Fig. 28]
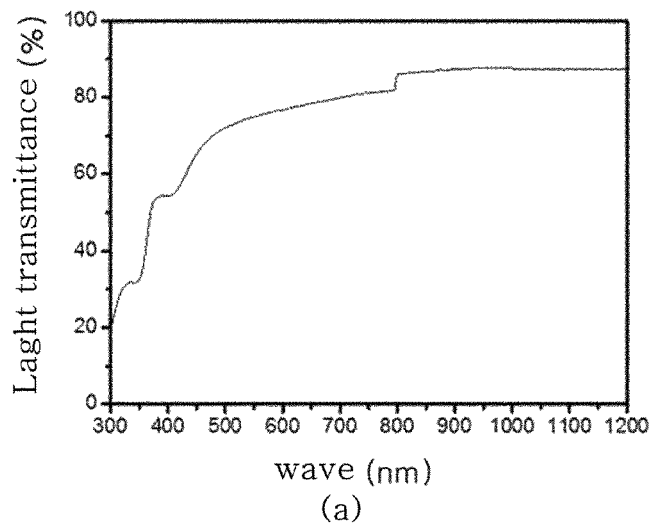
(a)
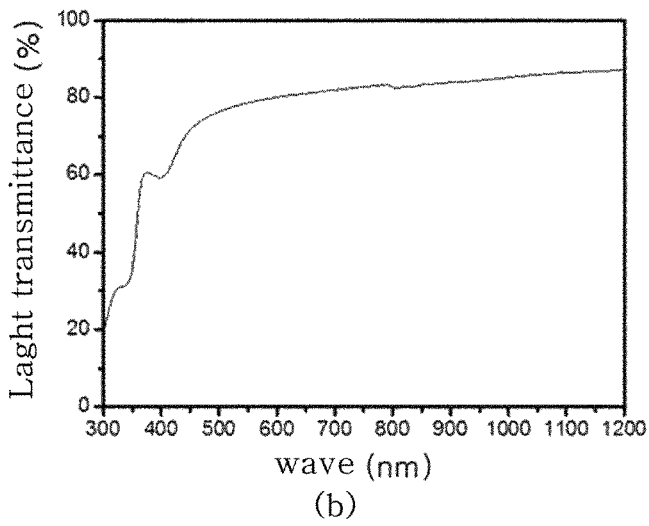
(b)
[Fig. 29]
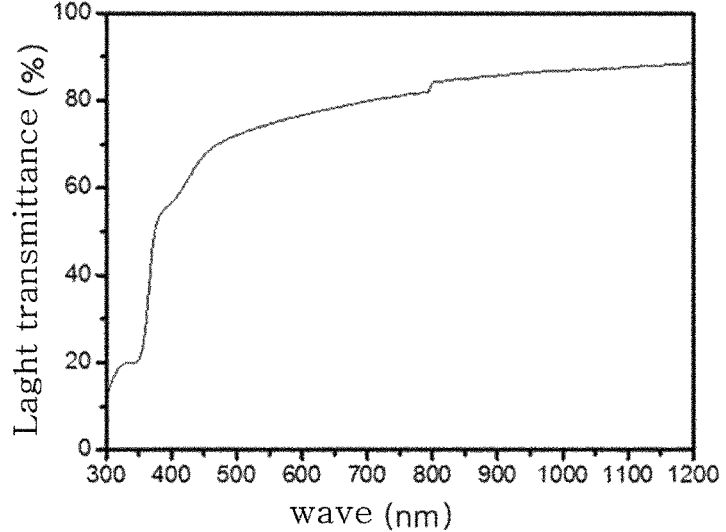

[Fig. 30]
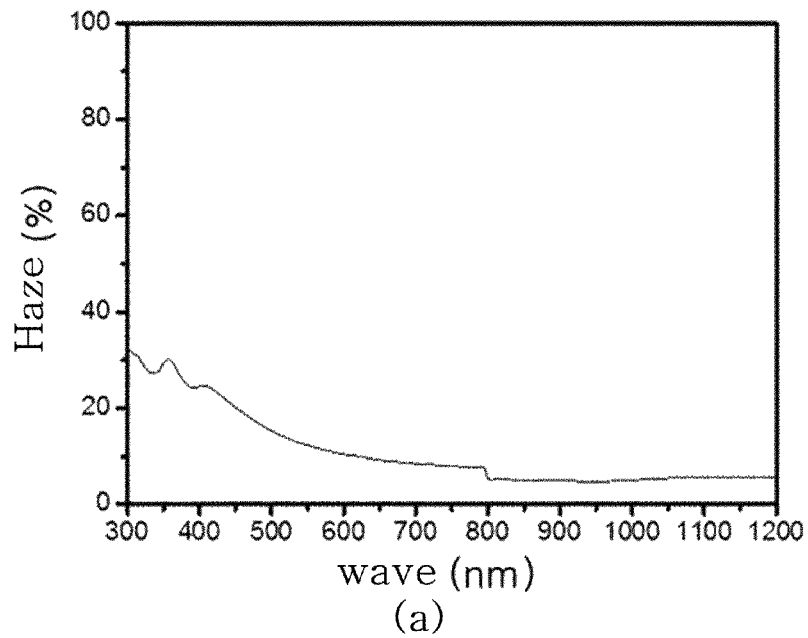
(a)
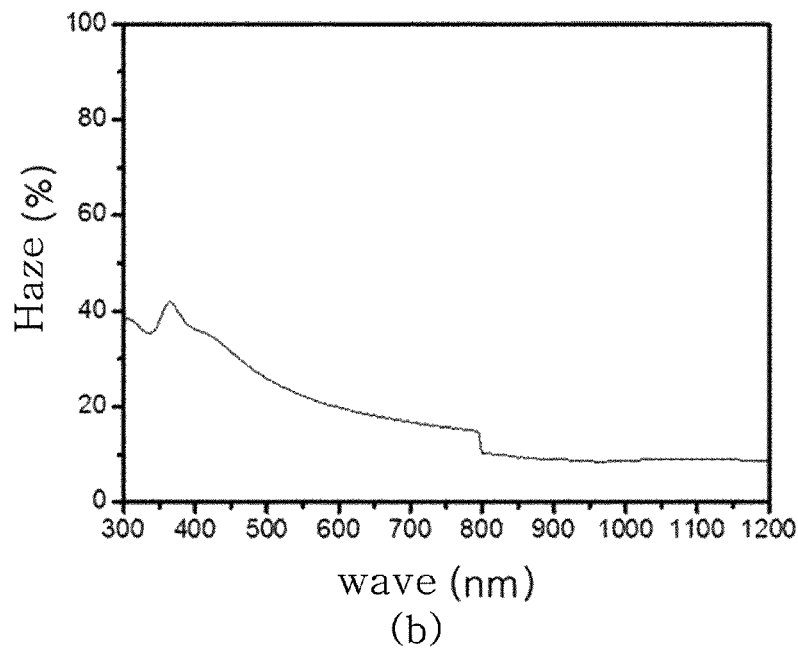
(b)

[Fig. 31]
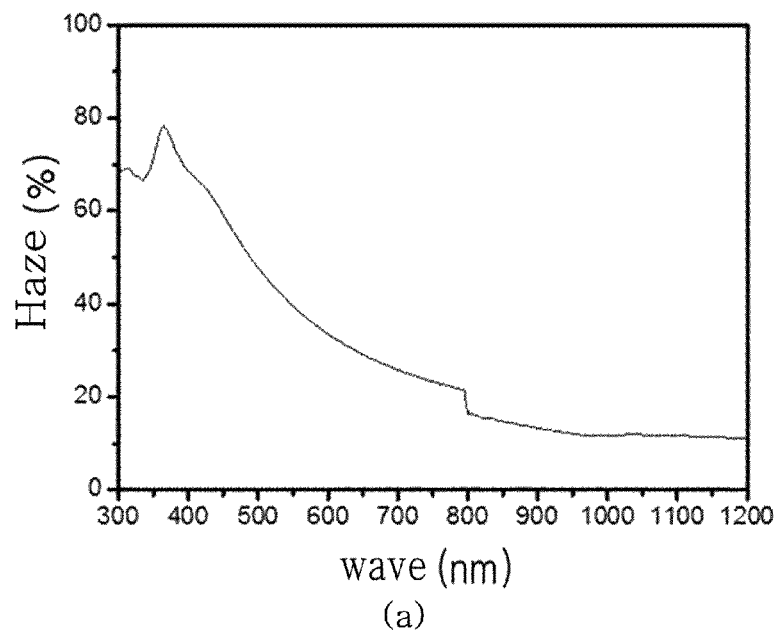
(a)
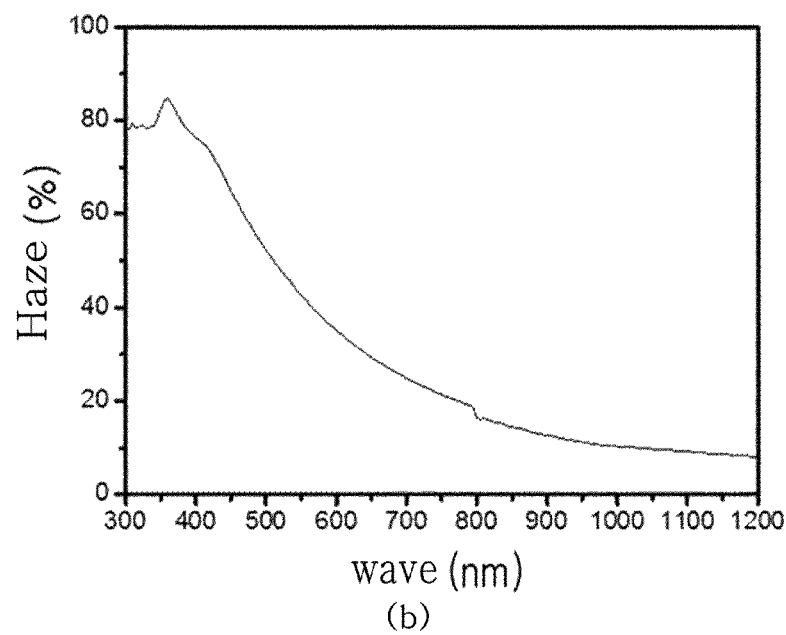
(b)

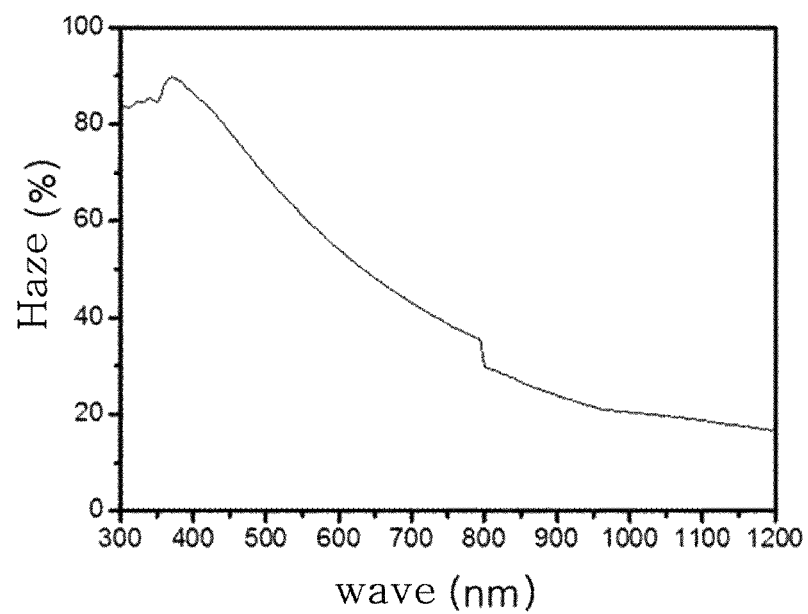
[Fig. 32]

[Fig. 33]
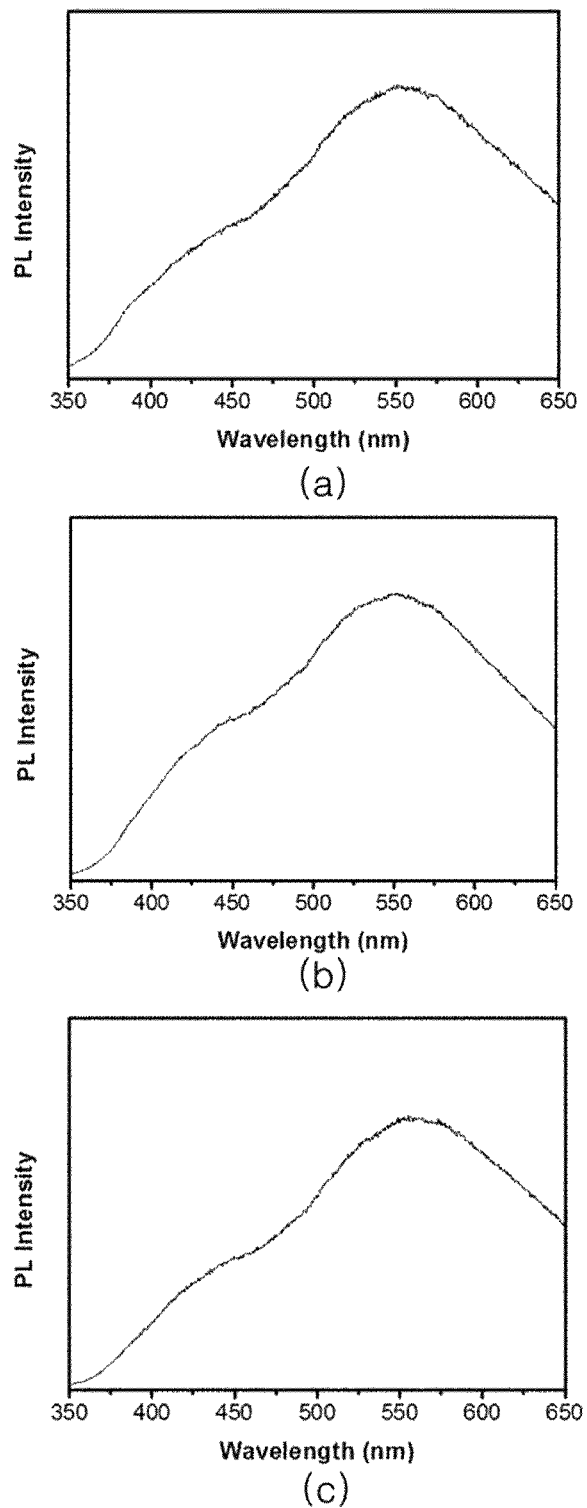

[Fig. 34]
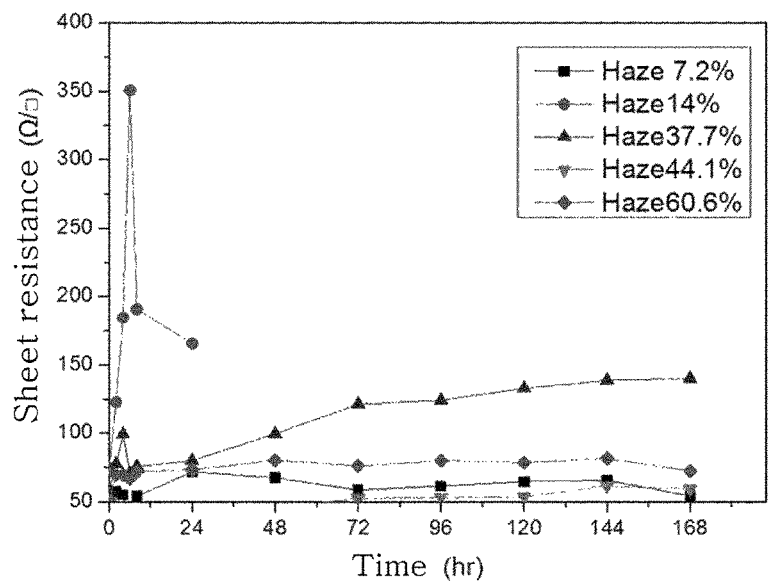
[Fig. 35]
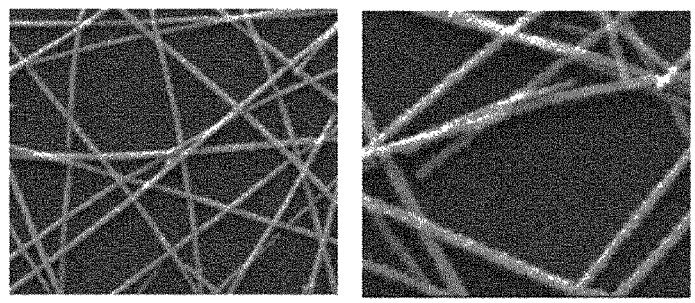
(a)
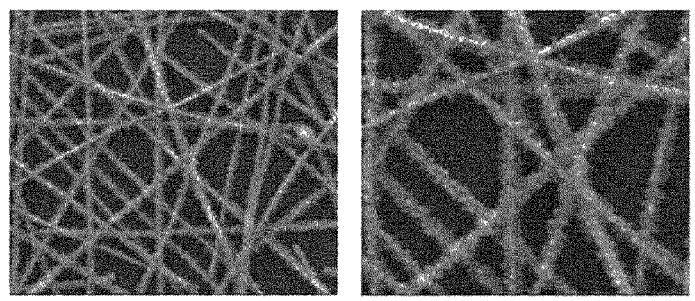
(b)
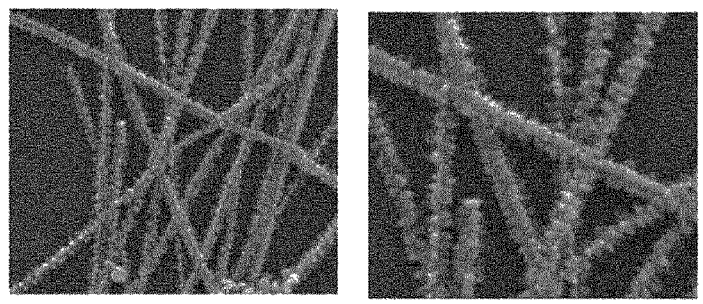
(c)

[Fig. 36]
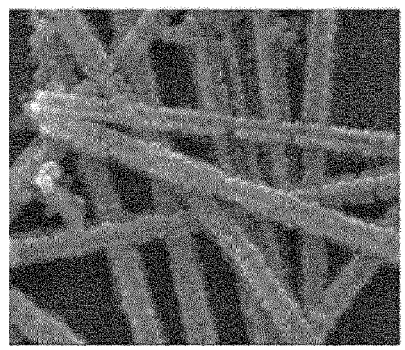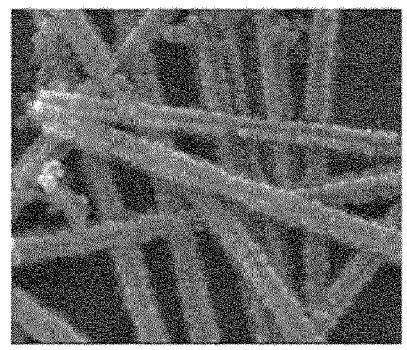
(a)
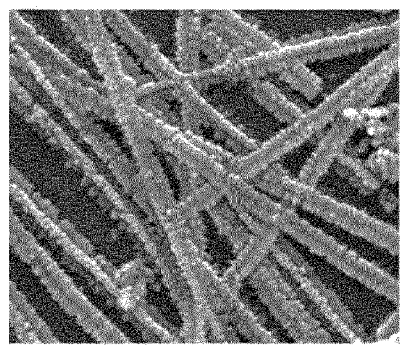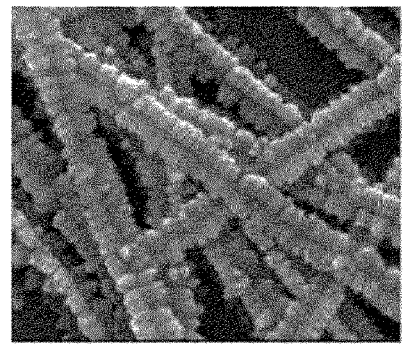
(b)
[Fig. 37]
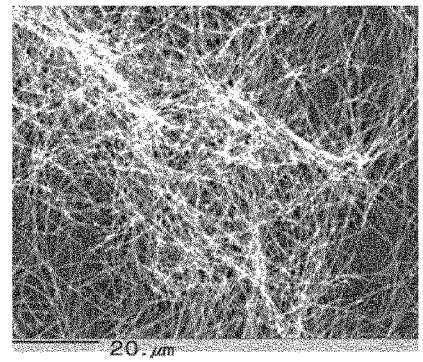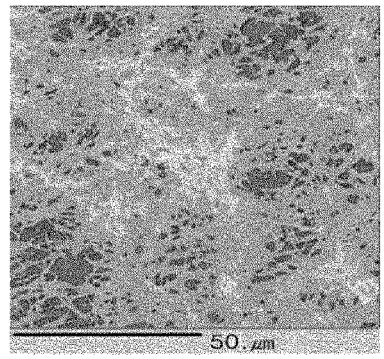
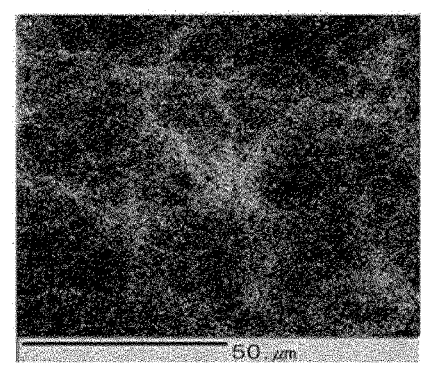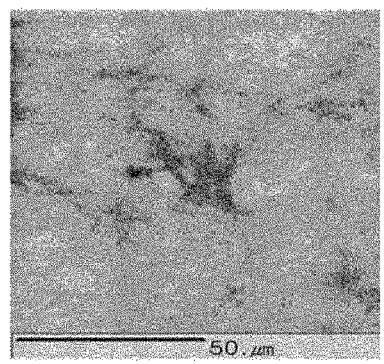

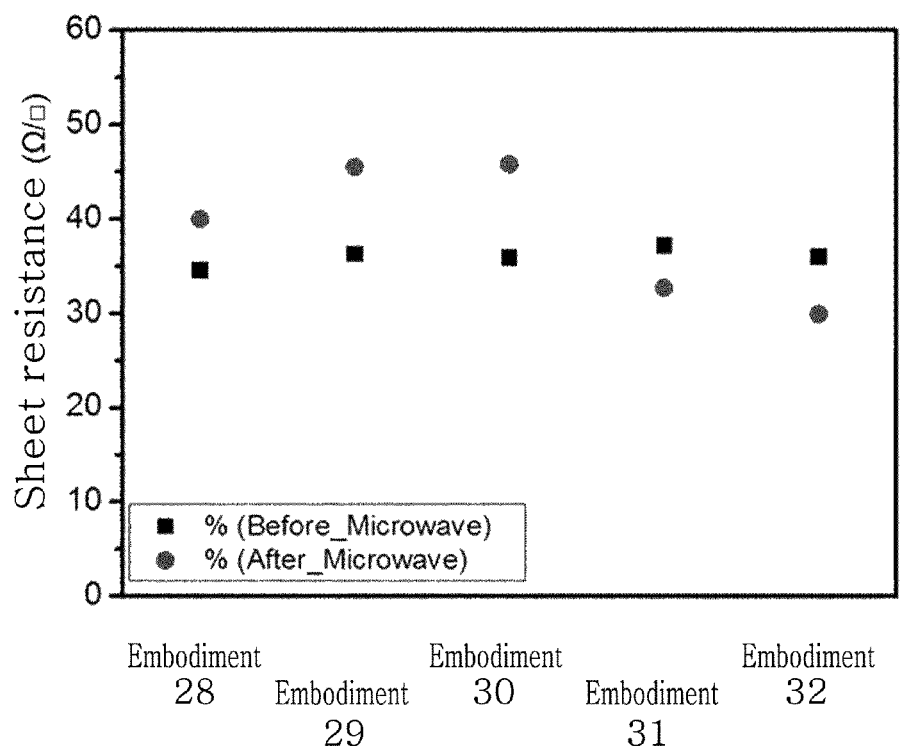
[Fig. 38]

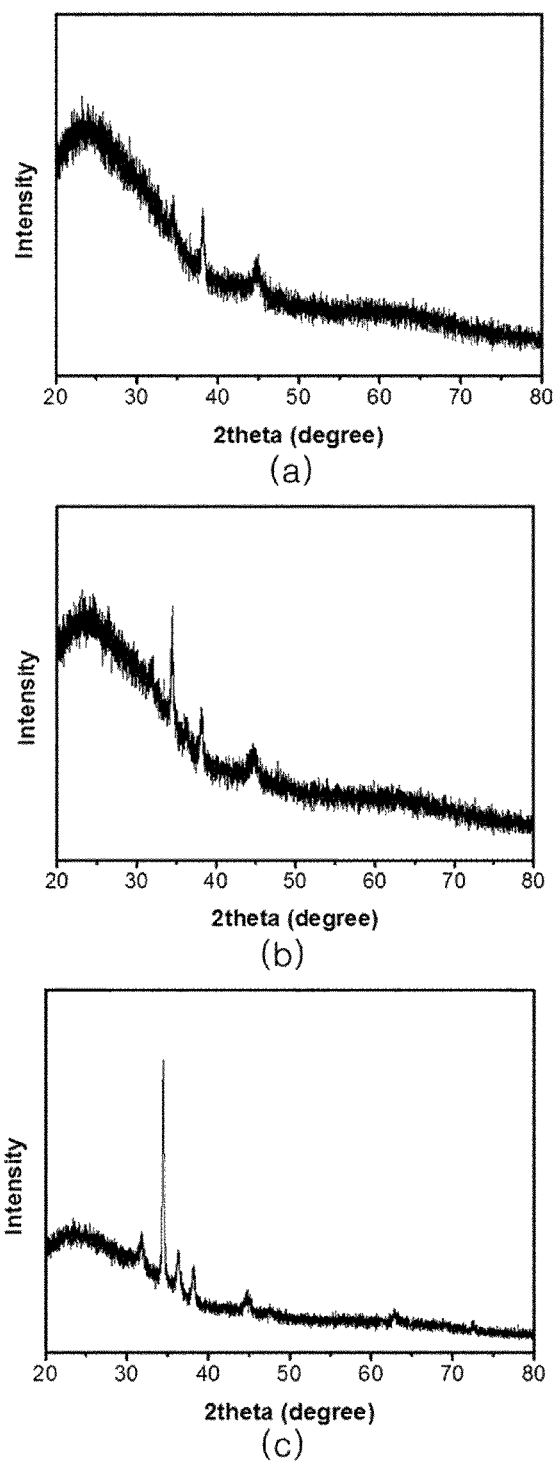
[Fig. 39]

[Fig. 40]
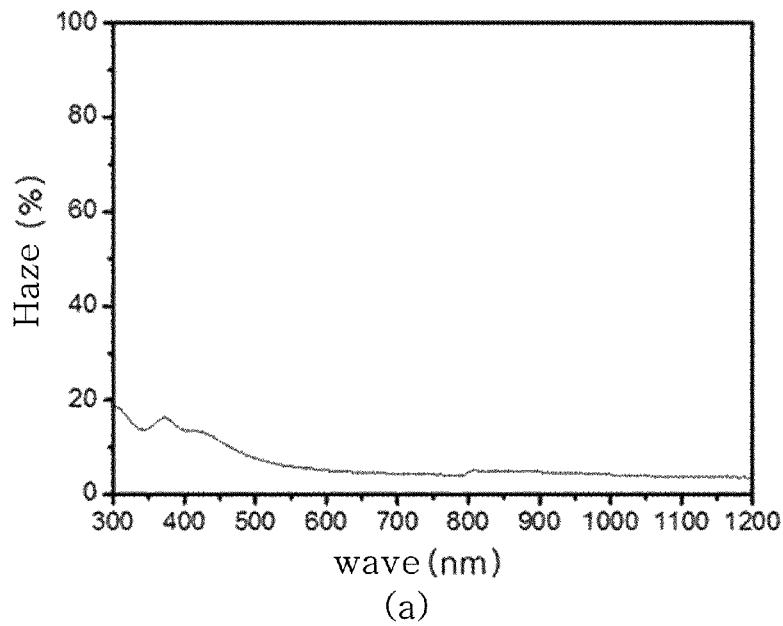
(a)
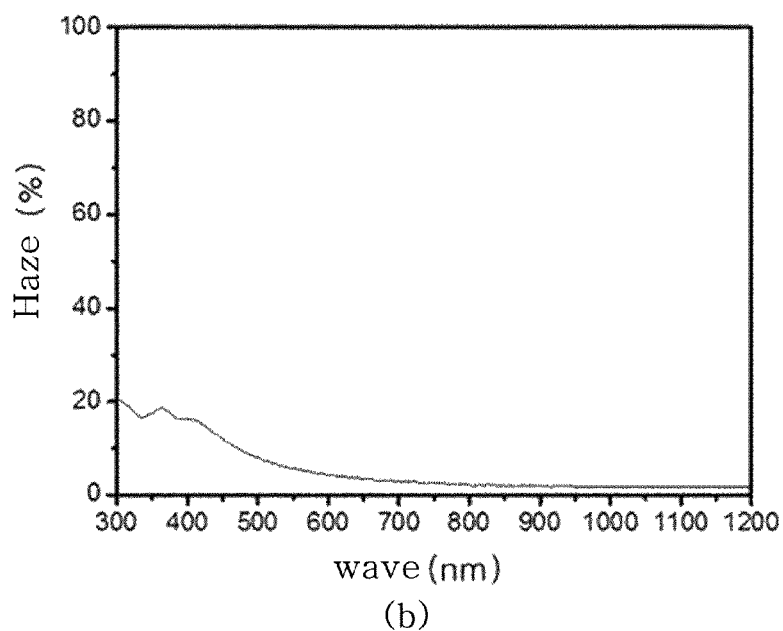
(b)

[Fig. 41]
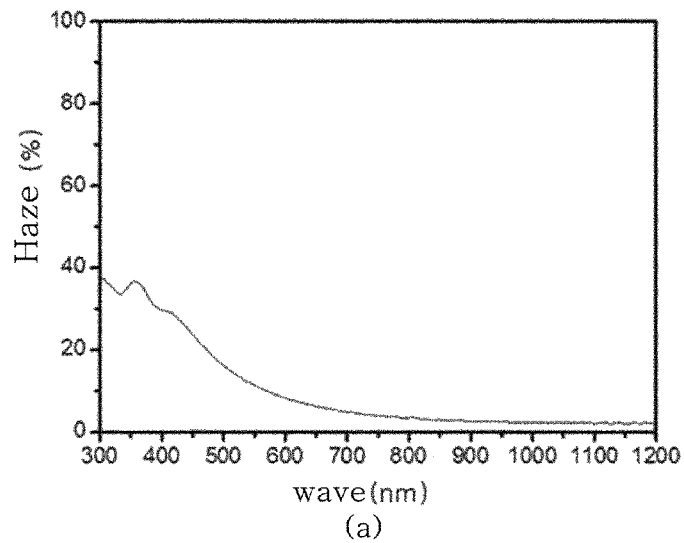
(a)
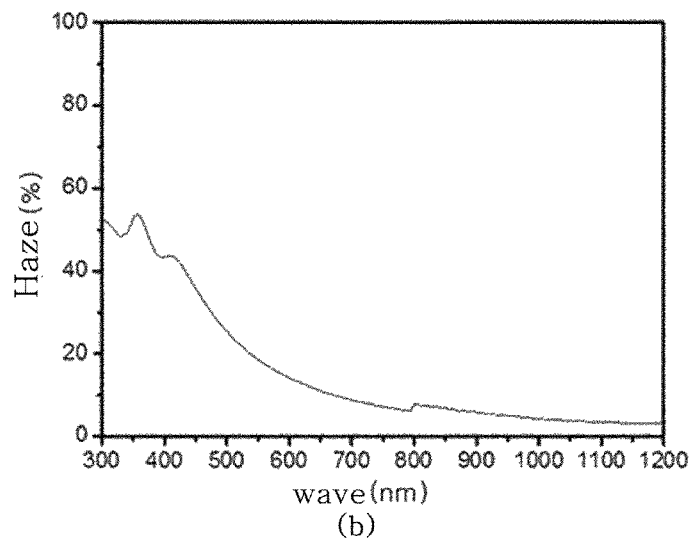
(b)
[Fig. 42]
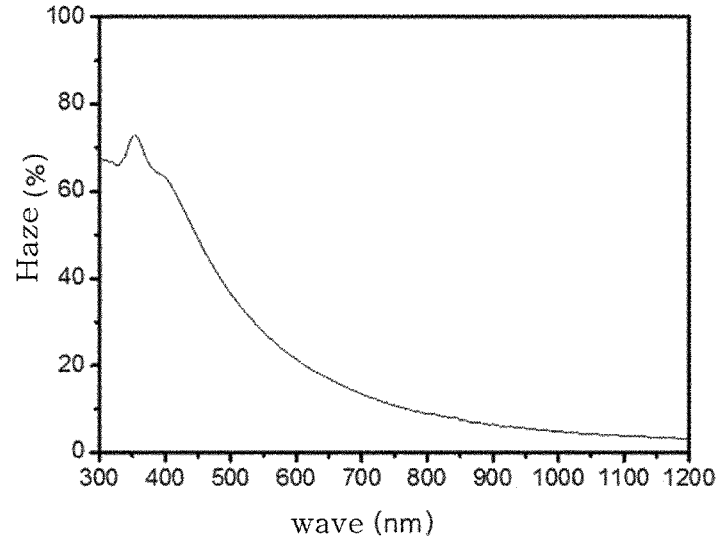

[Fig. 43]
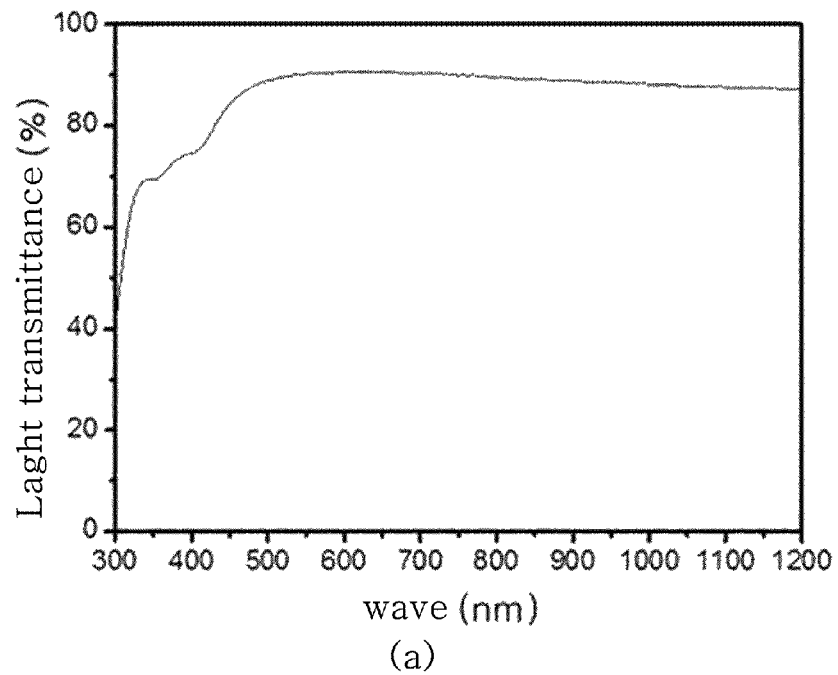
(a)
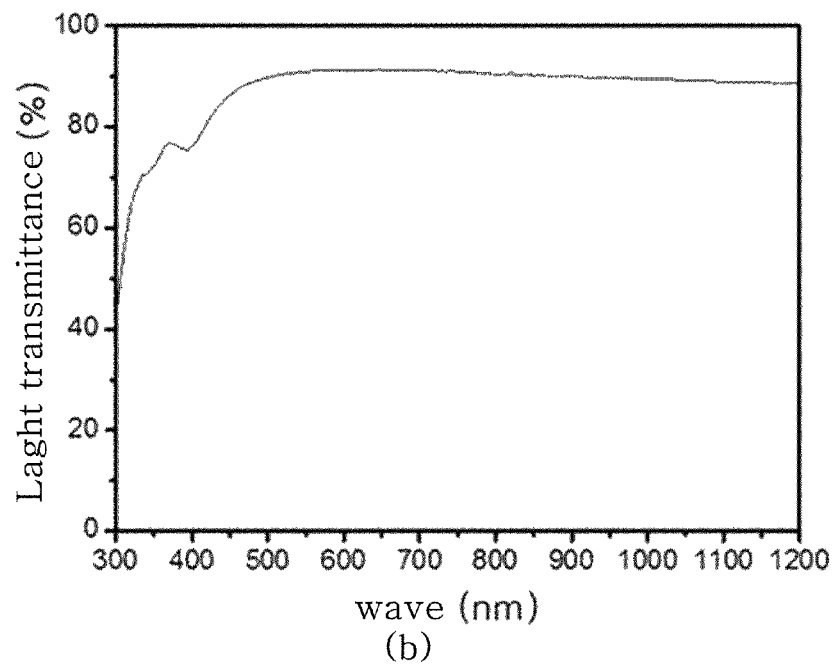
(b)

[Fig. 44]
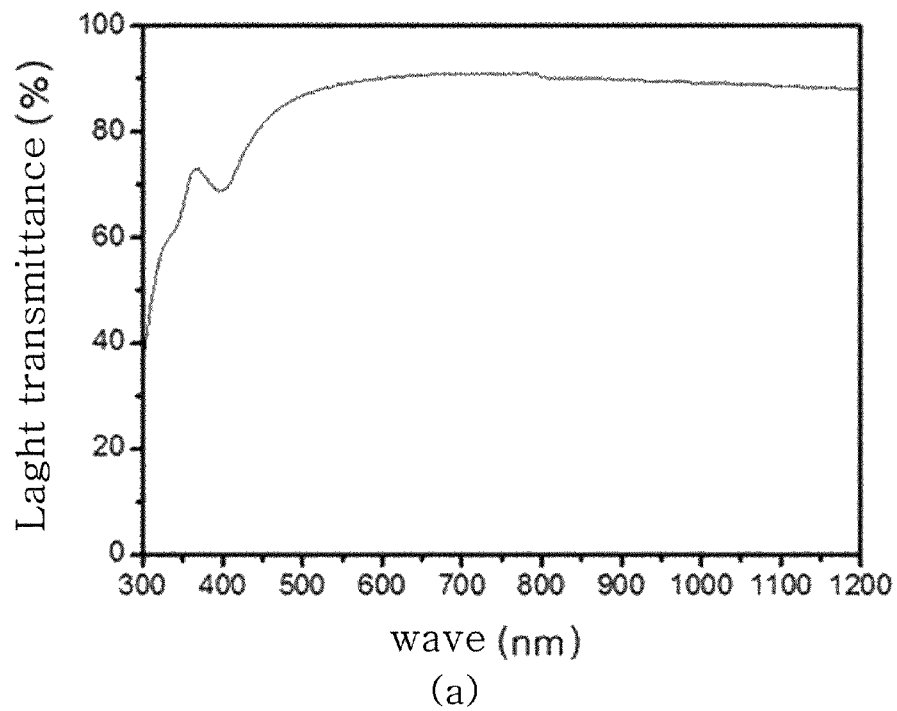
(a)
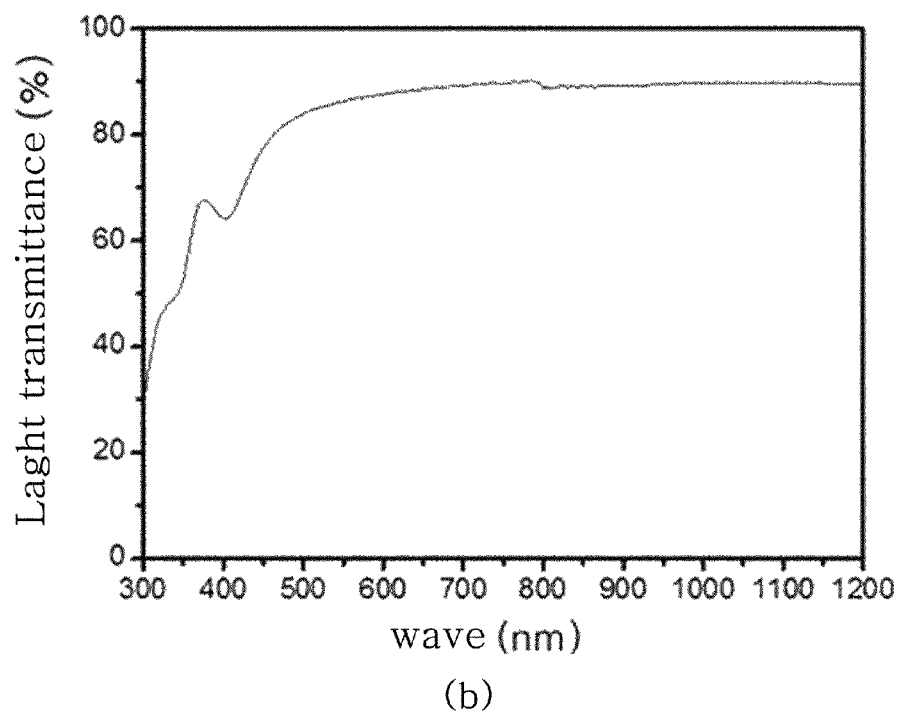
(b)

[Fig. 45]
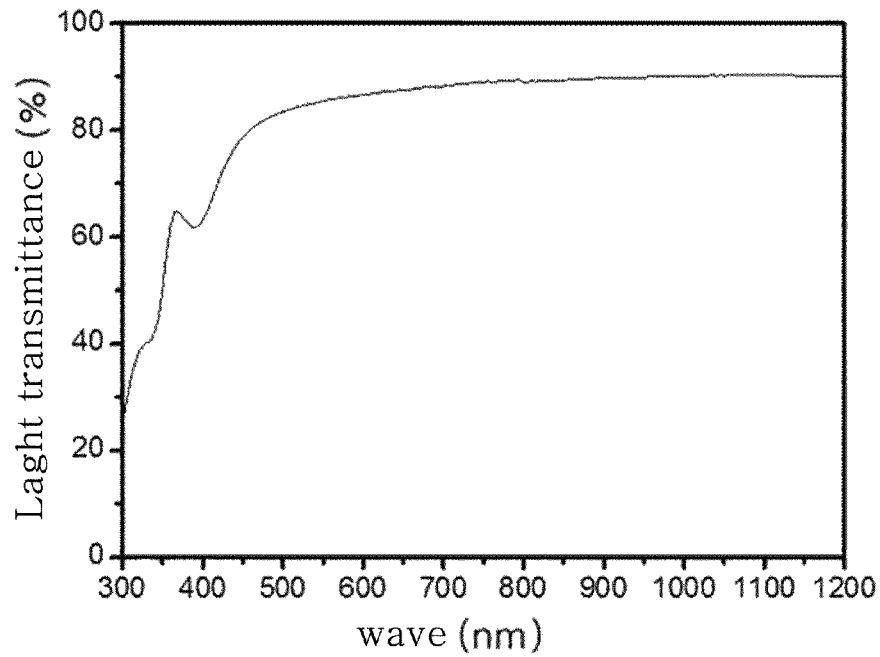
[Fig. 46]
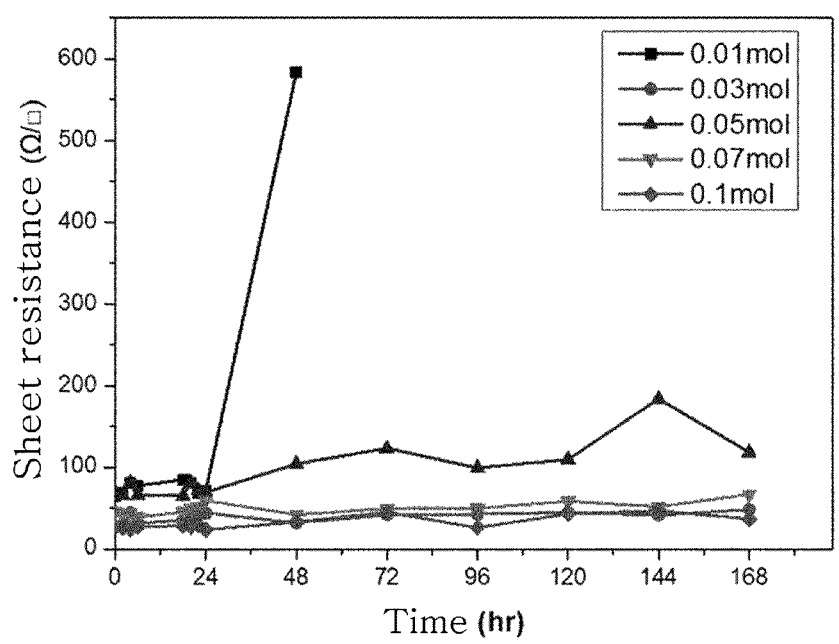

[Fig. 47]
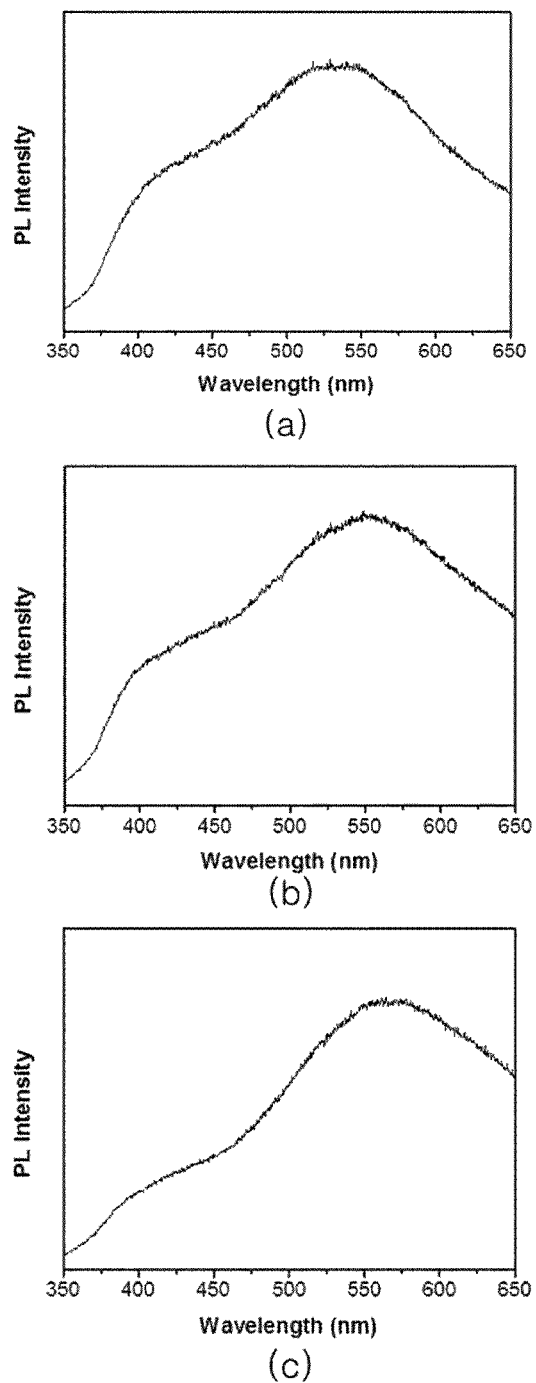
(a)
(b)
(c)

CORE-SHELL NANOWIRE, METHOD FOR SYNTHESIZING THE CORE-SHELL NANOWIRE, AND TRANSPARENT ELECTRODE AND ORGANIC LIGHT EMITTING DIODE INCLUDING THE CORE-SHELL NANOWIRE

CROSS-REFERENCE TO RELATED APPLICATIONS

This application is a U.S. National Stage application of International Application No. PCT/KR2015/000803 filed on Jan. 26, 2015, the entire disclosure of which is incorporated herein by reference for all purposes.

TECHNICAL FIELD

The present invention relates to a core-shell nanowire and a method for manufacturing the same and to a transparent electrode and an organic light emitting diode including the core-shell nanowire.

BACKGROUND ART

Recently, as technology of a display device and a solar cell progresses, demand for a transparent electrode used for the display device and the solar cell rapidly increases. An indium tin oxide (ITO) is generally to a material of the transparent electrode because the ITO is suitable for a mass production technique and for being used for the display device and the solar cell. However, a manufacturing cost of the ITO electrode is very high due to a vacuum process, and the ITO electrode is not stable to an external shock such as a thermal shock. Thus, a material replacing the ITO electrode is developing.

For materials replacing the ITO electrode, there are conductive polymers such as carbon nanotube (CNT), graphene, a zinc oxide (ZnO), poly(3,4-ethylenedioxythiophene) (PE-DOT), and so on, a metal nanowire, and the like.

The metal nanowire, more particularly, a silver nanowire among them has a high chemical stability. The silver nanowire has properties of silver having high thermal conductivity and high electric conductivity and an optical property being transparent induced by the nanowire having a very small size. Thus, the metal nanowire, more particularly, the silver nanowire is in the spotlight as a metal material for manufacturing a transparent conductive film. The silver nanowire may be widely applied to electronic, magnetic, and optical elements or devices and sensors, such as, a plasma display panel (PDP), an optical filter, an electromagnetic wave shield, an organic Light emitting diode (OLED), a solar cell, a liquid crystal display (LCD), a touch screen, an EL key pad for a cellular phone, and so on for the future.

The metal nanowire may be manufactured by a synthesizing method, known as a polyol method. In the polyol method, the metal salt is reduced to a metal atom by a polyol solvent (refer to US Laid-open Patent Publication No. 2005/0056118). Generally, the reduced metal atom initially forms seeds through a homogeneous nucleation process. And then, some of seeds grows in all direction in the solution and forms isotropic nano-structures (nanoparticles), and other seeds firstly grows according to a direction of a side surface and forms anisotropic nano-structures (nanotubes, nanowire portions, nano-belts, nanowires, and so on).

Recently, several studies for a flexible-substrate conductor using a metal nanowire are continued and a commercialization thereof is achieved to some agree. However, an electric resistance at contact points between nanowires may increase due to sulfidation and an oxidation, and an electric property may be bad. Thus, it may be a fatal defect for a device where reliability is needed.

In the past, studies for increasing an electric conductivity and reducing a haze were progressed, considering that the metal nanowire is used for a conductive material of a display device. However, a study for increasing light-scattering to have light extraction was not suggested.

DISCLOSURE

Terms, phrases, or expressions used in the specification are only for describing embodiments, not for limiting the scope and spirit of the invention. All of technical terms and scientific terms have meanings the same as meanings generally understood by the skilled person in the art so long as there is no special conflicting description.

In the entire specification, when an element, or a method or a step is referred to as "comprise", "comprising", "includes" or "including" another element or step, the element should not be understood as excluding other elements or steps so long as there is no special conflicting description, and the element may include at least one other element or step.

On the other hand, embodiments of the invention may be combined with the other embodiments so long as there is no special conflicting description. Particularly, preferable properties, structures, elements, or structures may be combined with the other properties, structure, elements, or structures. Hereinafter, embodiments of the invention and effects thereof will be described in detail with reference to the accompanying drawings.

Technical Problem

The invention has been made in view of the above problems, and it is an object of the invention to provide a metal nanowire having a large diameter and a large aspect ratio and including a plurality of wire portions having at least one bent portion. Thus, a contact probability between the metal nanowires can increase, an increase of a sheet resistance can be prevented, and an electric conductivity can be superior. Particularly, when the metal nanowire is used for a transparent electrode (particularly, for an OLED lighting, an organic solar cell, and so on), the transparent electrode has a transmittance and a haze suitable for the OLED lighting or the organic solar cell.

Also, it is another object of the invention to provide a metal nanowire having a large diameter and a large aspect ratio and having different diameters. Thus, a contact probability between the metal nanowires can increase, an increase of a sheet resistance can be prevented, and an electric conductivity can be superior. Particularly, when the metal nanowire is used for a transparent electrode (particularly, for an OLED lighting, an organic solar cell, and so on), the transparent electrode has a transmittance and a haze suitable for the OLED lighting or the organic solar cell.

In addition, it is yet another object of the invention to provide a core-shell nanowire having a metal coating. A sulfidation and an oxidation can be prevented and reliability can be enhanced. A light-scattering property can be enhanced, and a high haze can be achieved without largely reducing an electric conductivity and a transmittance.

Further, it is still another object of the invention to provide a method for manufacturing a metal nanowire having a large diameter and a large aspect ratio and including a plurality of wire portions having at least one bent portion with a high yield without by-products other than the metal nanowire.

Furthermore, it is yet still another object of the invention to provide a method for manufacturing a metal nanowire having a large diameter and a large aspect ratio and having different diameters with a high yield without by-products other than the metal nanowire.

Also, it is yet still another object of the invention to provide a method for manufacturing a core-shell nanowire having a metal coating.

Further, it is yet still another object of the invention to provide a transparent electrode and an organic light emitting diode including a metal nanowire having a large diameter and a large aspect ratio and including a plurality of wire portions having at least one bent portion as a conductor layer. Thus, an electric conductivity can be superior. Particularly, the transparent electrode has a transmittance and a haze suitable for an OLED lighting or an organic solar cell.

In addition, it is yet still another object of the invention to provide a transparent electrode and an organic light emitting diode including a metal nanowire having a large diameter and a large aspect ratio and having different diameters as a conductor layer. Thus, an electric conductivity can be superior. Particularly, the transparent electrode has a transmittance and a haze suitable for an OLED lighting or an organic solar cell.

Furthermore, it is yet still another object of the invention to provide a core-shell nanowire having a metal coating as a conductor layer. A sulfidation and an oxidation can be prevented and reliability can be enhanced. A light-scattering property can be enhanced, and a high haze can be achieved without largely reducing an electric conductivity and a transmittance.

Technical Solution

A core nanowire according to an embodiment includes a nanowire core; and a metal-compound shell formed on the nanowire core.

(1) A Metal Nanowire
1) A Metal Nanowire Including a Plurality of Wire Portions Having at Least One Bent Portion A metal nanowire according to an embodiment of the invention includes at least two wire portions (or at least one bent portion). More particularly, the metal nanowire includes at least one wire portion connected to another wire portion through the bent portion. An angle ($\alpha$) between an n-th wire portion and an (n+1)-th wire portion connected to the n-th wire portion through an n-th bent portion satisfies an inequation of $0°<\alpha<180°$.

For example, when the metal nanowire includes two wire portions, a first wire portion and a second wire portion connected to the first wire portion through a first bent portion have an angle ($\alpha$) therebetween, as shown in FIG. 1. As another example, the metal nanowire may include a plurality of wire portions, as shown in FIG. 2.

More particularly, the angle ($\alpha$) between the n-th wire portion and the (n+1)-th wire portion connected to the n-th wire portion through the n-th bent portion satisfies an inequation of $130°\leq\alpha\leq170°$. When the metal nanowires are synthesized by a method for manufacturing a metal nanowire including the plurality of wire portions having at least one bent portion according to the invention that will be described later, although some metal nanowires having at least one bent portion with an angle of 90° or less are formed among the metal nanowires having two wire portion (or one bent portion), almost metal nanowires have two to four wire portions (or one bent portion to three bent portions) and the angle of the bent portion is in a range of 130° to 170°.

In the metal nanowire including the wire portions having the bent portion according to the invention, when the metal nanowire is synthesized, as crystals are grown, strain increases in order to release stress generated by a gravity applied to grown sites of the metal nanowire. Accordingly, the metal nanowire has a structure bent in a predetermined direction to have a predetermined angle. When at least one bent portion has the predetermined angle, contact points, contact areas, or a contact probability between the metal nanowires can increase. Accordingly, an electric conductivity of a transparent electrode or a conductor layer formed of the metal nanowires according to the embodiment can be superior, compared with a transparent electrode or a conductor layer formed or a metal nanowire having a shape of a straight line.

Also, the metal nanowire according to the embodiment of the invention has a two-dimensional or three-dimensional structure. When a plane including the n-th wire portion and the (n+1)-th wire portion is an A plane and a plane including the (n+1)-th wire portion and an (n+2)-th wire portion is a B plane, an angle ($\beta$) of the B plane with respect to the A plane is in a range of $-10°$ to $10°$. FIG. 3 illustrates a metal nanowire having a three-dimensional structure according to another embodiment of the invention.

The metal nanowire including the wire portions having the bent portion according to an embodiment of the invention has a diameter of 50 to 200 nm and a length of 40 to 300 μm. In the present specification, the diameter of the metal nanowire indicates a longest length of the metal nanowire in a horizontal cross section of the metal nanowire, and the length of the metal nanowire indicates a longest length of the metal nanowire in a longitudinal cross section of the metal nanowire. Also, the metal nanowire has an aspect ratio is in a range of 200 to 6000. The aspect ratio is a ratio (length/diameter) of the length to the diameter.

The metal nanowire including the wire portions having the bent portion according to the embodiment of the invention has a large diameter of 50 to 200 nm, and thus, the metal nanowire is grown to be bent, not to be broken, even the stress above a predetermined value is applied to the metal nanowire when the metal nanowire is synthesized. Also, since the metal nanowire has a long length of 40 to 300 μm, the metal nanowire has the at least one bent portion. In addition, the metal nanowire is bent in a predetermined direction (that is, a gravity direction). Accordingly, when the metal nanowire has two or more bent portions, the metal nanowire has a bent curve structure, not a zigzag structure.

Also, contact areas between the metal nanowires, each having the diameter, the length, and the aspect ratio of the above ranges, are larger than contact areas between metal nanowires, each has a size smaller than the above ranges. Thus, an electric conductivity of a transparent electrode or a conductor layer formed of the metal nanowires according to the embodiment can be superior. Therefore, the metal nanowire can be suitable for a material of a transparent electrode.

The metal nanowire according to the embodiment of the invention may be a nanowire of a metal material including Ni, Co, Fe, Pt, Au, Ag, Al, Cr, Cu, Mg, Mn, Mo, Rh, Si, Ta, Ti, W, U, V, Zr, Ge, and so on. The metal nanowire of silver (Ag) has a high chemical stability among various metals, has greatly superior thermal conductivity and electric conductivity, and has a transparency, which is an optical property shown by a small size of a nanowire. Thus, the metal nanowire can be suitable for a metal material for manufacturing a transparent conductive layer.

In addition, the metal nanowire (particularly, the silver nanowire) according to the embodiment of the invention can be widely applied to electronic, magnetic, and optical elements or devices and sensors, such as, a plasma display panel (PDP), an optical filter, an electromagnetic wave shield, an organic Light emitting diode (OLED), a solar cell, a liquid crystal display (LCD), a touch screen, an EL key pad for a cellular phone, and so on.

2) A Metal Nanowire Having Different Diameters

The metal nanowire according to another embodiment of the invention includes a plurality of wire parts having different diameters. For example, the metal nanowire includes a first wire part and a second wire part extended from the first wire part. The first wire part has a diameter (a first diameter) of 50 to 100 nm and a length of 40 to 100 µm, and the second wire part has a diameter (a second diameter) of 150 to 1100 nm and a length of 5 to 15 µm. FIG. 4 illustrates a metal nanowire including a plurality of wire parts having different diameters according to yet still another embodiment of the invention.

Also, in the metal nanowire according to the embodiment of the invention, the second diameter is two times to fifteen times the first diameter. When the second diameter is below two times the first diameter, a light-scattering effect may be less. When the second diameter is above fifteen times the first diameter, the transmittance of a transparent electrode may be reduced and the dispersibilty may be reduced in a case that the metal nanowire can be suitable for the transparent electrode. Preferably, the second diameter may be two times to five times the first diameter.

The second wire part may be formed at one end or two ends of the first wire part. Also, two or more second wire parts may be formed at each end of the first wire part. FIG. 5 illustrates a metal nanowire including a plurality of wire parts having different diameters according to another embodiment of the invention, wherein (a) illustrates the metal nanowire having the second wire part formed at one end and (b) illustrates the metal nanowire having the second wire parts formed at both ends. Thus, the metal nanowire has an increased contact area with another metal nanowire by the second wire portion, and thus, the metal can be suitable for a metal material for manufacturing a transparent conductive layer.

A cross section of one of each of the first wire part and the second wire part perpendicular to a longitudinal direction of the metal nanowire may have a polygonal shape, for example, a triangular shape, a quadrangular shape, a pentagonal shape, and so on. However, the embodiment is not limited thereto.

When the metal nanowire having the plurality of wire parts having different diameters according to the embodiment of the invention is used for a conductor layer of a transparent electrode, a transparency is 80% or more. Thus, the metal nanowire can have properties suitable for an OLED lighting.

Also, when the metal nanowire including the plurality of wire parts having different diameters according to the embodiment of the invention is used for the conductor layer of the transparent electrode, a haze is 1% or more, and a light extraction can be induced through a light-scattering effect. Accordingly, when the metal nanowire is used for the OLED lighting, efficiency of the OLED lighting can be enhanced.

When the conventional metal nanowire having a uniform diameter generally has a low haze of 1% or less, there is almost never the light-scattering effect. On the other hand, the metal nanowire including the second wire part according to the embodiment has a light-scattering effect and has a large haze.

In addition, the conventional metal nanowire has a large surface area even the conventional metal a small weight and volume, and thus, may be easily aggregated. Thus, when the conventional metal nanowire is generally used for the transparent electrode, the dispersibility decreases and a sheet resistance ($\Omega/\square$) increases. Meanwhile, the metal nanowire including the second wire part according to the embodiment can have a superior dispersibility and the sheet resistance of the metal nanowire can be prevented.

3) A Metal Nanowire Including a Plurality of Wire Portions Having at Least One Bent Portion and Having Different Diameters The metal nanowire including a plurality of wire portions having at least one bent portion may include wire portions having diameters different from each other, or may include at least one wire portion having multiple diameters. The wire portion may include a plurality of wire parts having different diameters. That is, the metal nanowire including the plurality of wire portions having at least one bent portion has at least two different diameters. Accordingly, the wire portions of the metal nanowire according to the embodiment of the invention may include a wire portion having a single diameter of a first diameter, a wire portion having a single diameter of a second diameter, and/or the wire portion having the multiple diameters.

The wire portion having the single diameter has a first diameter of 500 to 200 nm and/or a second diameter of 150 to 1100 nm. The wire portion having the multiple diameters may have both of the first diameter of 50 to 200 nm and the second diameter of 150 to 1100 nm. FIG. 6 illustrates the wire portions according to embodiments of the invention, and FIG. 7 illustrates the metal nanowire according to embodiments of the invention.

The second diameter is two times to fifteen times the first diameter. When the second diameter is below two times the first diameter, a light-scattering effect may be less. When the second diameter is above fifteen times the first diameter, the transmittance of a transparent electrode may be reduced and the dispersibilty may be reduced in a case that the metal nanowire is used for the transparent electrode. Preferably, the second diameter may be two times to five times the first diameter.

The wire portion including the second diameter may be generally included at an end of the metal nanowire. However, the embodiment is not limited thereto. According to an amount of a capping agent when the metal nanowire is synthesized, the wire portion having the multiple diameters may be formed at an arbitrary position or a position other than the end of the metal nanowire.

As another aspect, at least one of wire portions of the metal nanowire having different diameters has a bent portion. Referring to FIG. 8, a wire portion or a wire part having a first diameter or a wire portion or a wire part having a second diameter has a shape of a straight line or has a bent portion.

When the wire portion or the wire part has the bent portion, a bent angle ($\alpha$) satisfies an inequation of $130°\leq\alpha\leq170°$. FIG. 8 illustrates various wire parts according to embodiments and FIG. 9 illustrates various metal nanowires according to embodiments of the invention when the nanowire includes two wire portions.

4) A Core-Shell Nanowire Having a Metal Coating

The core-shell nanowire according to an embodiment of the invention includes a nanowire core and a metal-compound shell coated on the nanowire core.

The nanowire core may be a conductive metal nanowire, for example, a silver (Ag) nanowire. Various commercialized or marketed metal nanowires may be unlimitedly used for the nanowire core. Preferably, the metal nanowire including the plurality of wire portions having the at least one bent portion, and the metal nanowire having different diameters, and the metal nanowire including the plurality of wire portions having the at least one bent portion and having different diameters may be used for the nanowire core.

For example, a cross section of the nanowire core perpendicular to a longitudinal direction of the nanowire core may have a polygonal shape, for example, one of a triangular shape, a quadrangular shape, a pentagonal shape, a hexagonal shape, and so on. However, the embodiment is not limited to the shape of the nanowire core. When the cross section of the nanowire core has the polygonal shape, the metal-compound shell can be coated so that the light-scattering property can be enhanced more.

The nanowire core has a diameter of 30 to 200 nm and a length of 10 μm to 300 μm. When the nanowire core is the metal nanowire including the plurality of wire portions having the at least one bent portion according to the embodiment, the nanowire core has a diameter of 50 to 200 nm and a length of 40 μm to 300 μm. When the nanowire core having different diameters according to the embodiment, the nanowire core has the first diameter of 50 to 100 nm and the second diameter of 150 nm to 1100 nm, and a length of 5 μm to 15 μm.

The metal-compound shell is coated on the nanowire core to surround the nanowire core. The embodiment is not limited to a material of the metal-compound shell. However, the metal-compound shell may be preferably transparent, and may include a transparent conductive metal oxide, nitride, sulfide, or so on. For example, the transparent conductive metal-compound shell may include at least one of ZnO, SiO2, $SnO_2$, $TiO_2$, AlN, GaN, BN, InN, ZnS, CdS, ZnSe, ZnTe, CdSe, and a compound including carbon, and may be further include a dopant for having an electric conductivity. The transparent conductive metal-compound shell may be formed of one material or be formed of an alloy or a mixture having several materials. The transparent conductive metal-compound shell may have a single-layer structure or a multiple-layer structure.

In the conventional technology, the light-scattering of the nanowire should be less with consideration of the optical property, and the haze of the conductive layer formed of the nanowire should be small. However, in the embodiment of the invention, the core-shell nanowire having an increased light-scattering effect and a high haze value is suggested, contrary to the conventional technology.

In the embodiment, the light-scattering effect can be remarkably increased since a core-shell structure is introduced in order to increase the light scattering of the nanowire and the shell has a structure having an unprecedented protruded structure having a unique shape.

As an example, the metal-compound shell includes a plurality of protruded structures in a cross section perpendicular to a longitudinal direction of the core-shell metal nanowire. The protruded structure may have a shape where an area or a width gradually decreases as the distance from the nanowire core increases. The number of the protruded structures may be 3 to 6. However, the invention is not limited thereto. The expression of "the protruded structure may have a shape where an area or a width gradually decreases as the distance from the nanowire core increases" may be interpreted in a broad sense. That is, the phrase implies may include a case that 70% or more of the protruded structure has the shape where the area or the width gradually decreases as the distance from the nanowire core increase although the protruded structure partially has a portion which area or a width gradually increase as the distance from the nanowire core increases.

As another example, the metal-compound shell when viewed in the cross section perpendicular to the longitudinal direction of the core-shell nanowire may have a shape of a plurality of polygons. The number of the polygons may be 3 to 6. However, the invention is not limited thereto. The "polygons" may be interpreted in a broad sense. The "polygons" may include a shape similar to a polygon that is generally recognized as the polygon as well as a shape of an exact polygon in the cross section.

As yet another example, the metal-compound shell may a stripe pattern having a plurality of portions extending a longitudinal direction of the core-shell nanowire. The number of the plurality of portions constituting the stripe pattern may be three to six. However, the invention is not limited thereto.

As concrete examples, FIG. 10 to FIG. 13 illustrate core-shell nanowires according to embodiments of the invention. As shown in FIG. 10 to FIG. 13, a metal-compound shell 20 is coated on the nanowire core 10. The metal-compound shell 20 has a shape where metal-compound oxides are aggregated to each other. Metal-compound particles 21 may have diameters (e) in a range of 10 to 100 nm. However, the embodiment is not limited thereto.

As shown in FIG. 10, when viewed in the cross section perpendicular to the longitudinal direction of the metal nanowire, the metal-compound shell 20 has four triangular shapes to four stripe patterns. That is, each of the four triangular shapes extends in the longitudinal direction of the core-shell nanowire.

Selectively, as shown in (a) of FIG. 11, when viewed in the cross section perpendicular to the longitudinal direction of the metal nanowire, the metal-compound shell 20 has five triangular shapes to five stripe patterns. That is, each of the five triangular shapes extends in the longitudinal direction of the core-shell nanowire. As shown in (b) of FIG. 11, when viewed in the cross section perpendicular to the longitudinal direction of the metal nanowire, the metal-compound shell 20 has six triangular shapes to six stripe patterns. That is, each of the six triangular shapes extends in the longitudinal direction of the core-shell nanowire.

Meanwhile, as shown in FIG. 12, when viewed in the cross section perpendicular to the longitudinal direction of the metal nanowire, the metal-compound shell 20 has five trapezoid shapes to five stripe patterns. That is, each of the five trapezoid shapes extends in the longitudinal direction of the core-shell nanowire. By changing conditions of a method for forming the metal-compound shell, the triangular shape or the trapezoid shape can be manufactured. For example, even the process conditions for forming the triangular shape is applied, the metal-compound shell 20 can have the trapezoid shape by insufficient process conditions, such as, short time or a small amount of precursors (refer to FIG. 13).

When a side of the polygon adjacent to the nanowire core is a bottom side (d) of the polygon, the bottom side (d) of the polygon may has a length of 40 nm to 200 nm and the polygon has a height of 10 nm to 200 nm. When the height of the bottom side is below the range, the light-scattering effect may be less. When the length of the bottom side and/or the height is above the range, light loss due to the light absorption may increase.

The length (a) of the core-shell nanowire is not limited. For example, the length (a) may be in a range of 10 μm to 200 μm, and a ratio (c/a) of the height (c) of the polygon to the length (a) of the core-shell nanowire may be in arrange of 0.00006 to 0.02. In addition, when viewed in the cross section of the core-shell nanowire perpendicular to a longitudinal direction of the core-shell nanowire, a ratio (longest diameter/length) of the longest diameter of the core-shell nanowire to the length (a) of core-shell nanowire may be in a range of 0.0001 to 0.06. By the above structure, light of various wavelengths can be scattered.

The core-shell nanowire having the above structure has a superior light-scattering property. The haze detected when the core-shell nanowire is coated on a transparent substrate may be 3% or more at a wavelength of 550 nm, and, preferably, 20% or more at the wavelength of 550 nm. The haze may be 60% or more, as in following Embodiments.

Also, the sheet resistance of the coated layer including the core-shell nanowire is superior, for example, 60 (Ω/□) or less. The sheet resistance of the coated layer including the core-shell nanowire according to the embodiment is not largely worse than the sheet resistance of the coated layer including the metal nanowire that is not coated. Also, the sheet resistance of the coated layer including the core-shell nanowire according to the embodiment may lower than the sheet resistance of the coated layer including the metal nanowire that is not coated. In addition, the light transmittance at the wavelength of 550 nm (excepting for a substrate absorption) can be high, for example, 70 to 98%.

When the core-shell nanowire according to the embodiment of the invention is used for a conductor layer of a transparent electrode, a transmittance of the conductor layer of the transparent electrode is 80% or more. Thus, the core-shell nanowire can have properties suitable for an OLED lighting.

Also, when the core-shell nanowire according to the embodiment of the invention is used for the conductor layer of the transparent electrode, a haze is 1% or more, and a light extraction can be induced through a light-scattering effect. Accordingly, when the conductor layer of the transparent electrode including the metal nanowire is used for the OLED lighting, efficiency of the OLED lighting can be enhanced.

In addition, the conventional metal nanowire has a large surface area even the metal nanowire has a small weight and volume, and thus, the conventional metal nanowire may be easily aggregated. Thus, when the conventional metal nanowire is generally used for the transparent electrode, the dispersibility decreases and a sheet resistance (Ω/□) increases. Meanwhile, the core-shell nanowire according to the embodiment can have a superior dispersibility and the increase of a sheet resistance can be prevented.

(2) A Method for Manufacturing a Metal Nanowire

1) A Method for Manufacturing a Metal Nanowire Including a Plurality of Wire Portions Having at Least One Bent Portion In a method for manufacturing a metal nanowire including a plurality of wire portions having at least one bent portion according to an embodiment of the invention, all materials of a reaction mixture are added to a reaction container and a synthesized reaction is performed at a pressure of an atmospheric pressure or a pressure higher than the atmospheric pressure (for example, 1 to 5 atm) to manufacture the metal nanowire including the plurality of wire portions having the at least one bent portion.

The manufacturing method according to the embodiment of the invention can synthesize a metal nanowire having a diameter of 50 to 200 nm and a length of 40 to 300 μm. The metal nanowire is grown to be bent, not to be broken, even the stress above a predetermined value is applied to the metal nanowire when the metal nanowire is synthesized. And thus, the metal nanowire including at least two wire portions connected through the at least one bent portion can be manufactured.

In addition, the method is an one-pot synthesis. In the one-pot synthesis, a purification of intermediate products is not necessary, and the metal nanowire including at least two wire portions having the at least one bent portion can be manufactured with a high yield without by-products other than the metal nanowire.

More particularly, the method for manufacturing the metal nanowire may include a step S10 of preparing a reaction mixture and a step S20 of synthesizing a metal nanowire. In the step S10 of preparing the reaction mixture, the reaction mixture including a metal salt, a capping agent, a reducing solvent, and a catalyst are prepared. In the step S20 of synthesizing the metal nanowire, the metal nanowire is grown by adding the reaction mixture to a reaction container and reacting with the reaction mixture in the reaction container. By controlling a composition and an amount of the reaction mixture, a reaction temperature, a reaction pressure, a reaction time, and so on, the metal nanowire including the plurality of wire portion having at least one bent portion with a large diameter and a large aspect ratio can be synthesized.

In the step S10 of preparing the reaction mixture, the reaction mixture is prepared by adding the metal salt, the capping agent, the reducing solvent, and the catalyst to the reaction container with a predetermined ratio and mixing them in the reaction container at a room temperature. The reducing solvent reduces the metal salt to a metal. The capping agent grows the reduced metal to have a wire shape.

The metal salt is a compound consisting of metal cation and organic or inorganic anion. For example, the metal cation may be a cation of a metal of Ni, Co, Fe, Pt, Au, Ag, Al, Cr, Cu, Mg, Mn, Mo, Rh, Si, Ta, Ti, W, U, V, Zr, Ge, and so on. The organic or inorganic anion may be $[NO_3]^-$, $[ClO_4]^-$, $[BF_4]^-$, $[PF_6]^-$, $[CH_3COO]^-$, $[CF_3SO_3]^-$, $[SO_4]^{2-}$, [CH3COCH=COCH3]$^-$, and so on. Two or more metal salts having similar ionization degrees may be mixed and the mixed metal salts may be used. Preferably, a silver salt consisting of cation of silver ($Ag^+$) and the organic or inorganic anion may be used.

The metal salt is dissolved by the reducing solvent, and is decomposed to the metal cation and the organic or inorganic anion. The decomposed metal cation is reduced, and then, is crystallized or grown to the metal nanowire.

A molar concentration of the metal salt is 0.03 mol/l to 0.4 mol/l. When the molar concentration is below 0.03 mol/l, an output of generated metal nanowire rapidly decreases. When the molar concentration is above 0.4 mol/l, the wires may be aggregated by an overproduction. More preferably, the molar concentration of the metal salt may be 0.05 mol/l to 0.10 mol/l.

The reducing solvent may be a polar solvent being able to dissolve the metal salt, the catalyst, and the capping agent. The reducing solvent has at least two hydroxyl groups in molecule. For example, a solvent such as a diol, a polyol, a glycol, or so on may be used. The reducing solvent acts as a reducing agent, and reduces the metal salt and forms a metal. As an example, at least one of ethyleneglycol, propyleneglycol, and glycerol may be used, More particularly, at least one of ethyleneglycol, 1, 2-propyleneglycol, 1, 3-propyleneglycol, glycerin, glycerol and diethylglycol may be used.

The capping agent is a chemical agent firstly interacting with side surfaces of the grown nanowire and being attached to the side surfaces of the grown nanowire so that a surface of a horizontal cross section of the nanowire can be crystallized. That is, the capping agent interacts with the side surface stronger than the surface of the horizontal cross section. Thus, the side surfaces are passivated, while the surface of the horizontal cross section is additionally crystallized to produce the nanowire.

For the capping agent, a surface-attached polymer such as polyvinylpyrrolidone (PVP), polyvinylalcohol (PVA), polyacrylamide (PAM), polyacrylicacid (PAA), and so on may be used.

The capping agent is included in an amount of 0.5 to 3.0 parts by weight with respect to 28 parts by weight of the reducing solvent. When the capping agent is included below 0.5 parts by weight, the diameter of the metal nanowire may increase. When the capping agent is included above 3.0 parts by weight, the length of the metal nanowire may largely decrease. The capping agent may be included by 2.0 to 3.0 parts by weight with respect to 28 parts by weight of the reducing solvent.

The catalyst is a salt additive including a cation and an anion bonded to each other through an ionic bond. The catalyst is separated to ions in the polar solvent such as water, an alcohol, a diol, and a polyol. In this instance, a cation may be an organic material or an inorganic material, and an anion may be generally an inorganic material and has a halogen ion ($Cl^-$, $Br^-$, $F^-$, or so on). Anisotropy nano structures are firstly grown by the catalyst, thereby obtaining the nanowire with a relatively high yield.

The catalyst may include at least one of a compound where a cation and an anion bonded to each other through an ionic bond and a hydrate thereof. The cation may be a cation of Al, $NH_4$, Sb, As, Ba, Bi, Cd, Ca, Cr, Co, Cu, Fe, H, Pb, Mg, Hg, Ni, K, Ag, Na, Sr, and/or Zn. The anion may be an anion of $C_2H_3O_2$, Br, $CO_3$, Cl, $CrO_4$, OH, I, $NO_3$, O, $C_2O_4$, $PO_4$, $SIO_3$, $SO_4$, S, and/or $SO_3$.

A molar concentration of the catalyst may be in a range of $10^{-5}$ mol/l to $10^{-2}$ mol/l. When the molar concentration is below $10^{-5}$ mol/l, the generation of the metal nanowire may be declined by a reduction of an initial nucleation. When the molar concentration is above $10^{-2}$ mol/l, a macro-aggregation may be induced or the surplus catalyst prevents an anisotropic growth of the metal nanowire, the diameter increases, and a generation of spherical particles may increase.

In the step S20 of synthesizing the metal nanowire, the prepared reaction mixture is reacted in the reaction container. Then, the crystal grows to the metal nanowire through reducing the metal cation and growing crystals from metal nucleation sites through the metal cation. By controlling the reaction temperature and the reaction time as well as the composition of the reaction mixture, the metal nanowire having a large diameter and a large aspect ratio and including the wire portion having the at least one bent portion is synthesized. According to reaction conditions, the diameter, the length, and properties related the bent portion of the synthesized metal nanowire can be controlled.

The reaction temperature of the step of synthesizing the metal nanowire may in a range of 110 to 150° C. When the reaction temperature is below 110° C., the time for synthesizing the metal nanowire may increase, an output may decreases. When the reaction temperature is above 150° C., the metal nanowire may be aggregated by an increase of the rapid reaction velocity.

The reaction time of the step of synthesizing the metal nanowire may be in a range of 3 to 12 hours. When the reaction time is below 3, the grown time of the nanowire may be not sufficient and the length may be small. When the reaction time is above 12, the nanowires may be aggregated by an overproduction.

In the step of synthesizing the metal nanowire, all materials of a reaction mixture are added to a reaction container and a synthesized reaction is performed at a pressure of an atmospheric pressure or a pressure high than the atmospheric pressure to synthesize the metal nanowire. By using an increased pressure, an evaporation point increases, and thus, the volatilization of the reaction solution can be minimized and a composition of the reaction solution can be maintained. Accordingly, the length of the metal nanowire according to the embodiment is 1.5 times or more the conventional metal nanowire. For increasing the pressure, the reaction container may be sealed, or an inert gas may be injected in the reaction container.

If the composition of the reaction mixture is changed when the metal nanowire is synthesized, the length of the synthesized metal nanowire may be varied. When the reaction is generated in the state that the reaction container is sealed, inflow and outflow of substances can be prevented during the reaction, and the constant composition can be maintained. Accordingly, the metal nanowires having uniform lengths can be obtained.

Additives may be added to synthesize the metal nanowire as necessary. For example, a stabilizer such as an antioxidant and so on, a dispersant, a viscosity increasing agent or a thickener, and so on may be further added, however, the embodiment is not limited. For example, so the length of the metal nanowire can be large, HCl or $HNO_3$ may be included in an amount of 0.1 to 1 parts by weight with respect to all catalysts contained.

The metal nanowire is cooled to a room temperature after the step of synthesizing the metal nanowire, and is cleaned by acetone, ethanol, so on, and then, is purified. Accordingly, the metal nanowire having a large diameter and a large aspect ratio and including wire portions having at least one bent portion can be obtained.

When the metal nanowire is manufactured by a manufacturing method according to an embodiment of the invention, the metal nanowire having different diameters, as well as, the metal nanowire including wire portions having at least one bent portion, can be synthesized.

2) A Method for Manufacturing a Metal Nanowire Having Different Diameters

In a method for manufacturing a metal nanowire having different diameters according to an embodiment of the invention, all materials of a reaction mixture are added to a reaction container and a synthesized reaction is performed at a pressure of an atmospheric pressure or a pressure higher than the atmospheric pressure (for example, 1 to 5 atm) to manufacture the metal nanowire having different diameters by controlling an amount of a capping agent in the reaction compound and a reaction time.

The manufacturing method according to an embodiment of the invention is for manufacturing the metal nanowire having at least two wire portions or wire parts. The metal nanowire includes an n-th wire portion or part and an (n+1) wire portion or part connected to the n-th wire portion or part. According to the manufacturing method, the metal nanowire having the n-th wire portion or part of the n-th diameter and the (n+1)-th wire portion or part of the (n+1)-th diameter of can be synthesized. By controlling elements preventing the surface growth of the metal nanowire, the metal nanowire having different diameters can be synthesized.

The manufacturing method according to the embodiment of the invention can synthesize a metal nanowire having a diameter of 50 to 200 nm and a length of 40 to 300 µm. The metal nanowire is grown to be bent, not to be broken, even the stress above a predetermined value is applied to the metal nanowire when the metal nanowire is synthesized. And thus, the metal nanowire having different diameters can be manufactured.

In addition, the method is an one-pot synthesis. In the one-pot synthesis, a purification of intermediate products is not necessary, and the metal nanowire having different diameters can be manufactured with a high yield without by-products other than the metal nanowire.

More particularly, the method for manufacturing the metal nanowire may include a step S11 of preparing a reaction mixture and a step S21 of synthesizing a metal nanowire. In the step S11 of preparing the reaction mixture, the reaction mixture including a metal salt, a capping agent, a reducing solvent, and a catalyst are prepared. In the step S21 of synthesizing the metal nanowire, the metal nanowire is grown by adding the reaction mixture to a reaction container and reacting with the reaction mixture in the reaction container. By controlling a composition and an amount of the reaction mixture, a reaction temperature, a reaction pressure, a reaction time, and so on, the metal nanowire having different diameters with a large diameter and a large aspect ratio can be synthesized.

In the step S11 of preparing the reaction mixture, the reaction mixture is prepared by adding the metal salt, the capping agent, the reducing solvent, and the catalyst to the reaction container with a predetermined ratio and mixing them in the reaction container at a room temperature. The reducing solvent reduces the metal salt to a metal. The capping agent grows the reduced metal to have a wire shape.

The metal salt is a compound consisting of metal cation and organic or inorganic anion. For example, the metal cation may be a cation of a metal of Ni, Co, Fe, Pt, Au, Ag, Al, Cr, Cu, Mg, Mn, Mo, Rh, Si, Ta, Ti, W, U, V, Zr, Ge, and so on. The organic or inorganic anion may be $[NO_3]^-$, $[ClO_4]^-$, $[BR_4]^-$, $[PF_6]^-$, $[CH_3COO]^-$, $[CF_3SO_3]^-$, $[SO_4]^{2-}$, $[CH3COCH=COCH3]^-$, and so on. Two or more metal salts having similar ionization degrees may be mixed and the mixed metal salts may be used. Preferably, a silver salt consisting of cation of silver ($Ag^+$) and the organic or inorganic anion may be used.

The metal salt is dissolved by the reducing solvent, and is decomposed to the metal cation and the organic or inorganic anion. The decomposed metal cation is reduced, and then, is crystallized or grown to the metal nanowire.

A molar concentration of the metal salt is 0.03 mol/l to 0.4 mol/l. When the molar concentration is below 0.03 mol/l, an output of generated metal nanowire rapidly decreases. When the molar concentration is above 0.4 mol/l, the wires may be aggregated by an overproduction. More preferably, the molar concentration of the metal salt may be 0.05 mol/l to 0.10 mol/l.

The reducing solvent may be a polar solvent being able to dissolve the metal salt, the catalyst, and the capping agent. The reducing solvent has at least two hydroxyl groups in molecule. For example, a solvent such as a diol, a polyol, a glycol, or so on may be used. The reducing solvent acts as a reducing agent, and reduces the metal salt and forms a metal. As an example, at least one of ethyleneglycol, propyleneglycol, and glycerol may be used, More particularly, at least one of ethyleneglycol, 1, 2-propyleneglycol, 1, 3-propyleneglycol, glycerin, glycerol and diethylglycol may be used.

The capping agent is a chemical agent firstly interacting with side surfaces of the grown nanowire and being attached to the side surfaces of the grown nanowire so that a surface of a horizontal cross section of the nanowire can be crystallized. That is, the capping agent interacts with the side surface stronger than the surface of the horizontal cross section. Thus, the side surfaces are passivated, while the surface of the horizontal cross section is additionally crystallized to produce the nanowire.

For the capping agent, a surface-attached polymer such as polyvinylpyrrolidone (PVP), polyvinylalcohol (PVA), polyacrylamide (PAM), polyacrylicacid (PAA), and so on may be used.

The capping agent is included in an amount of 0.05 to 1.0 parts by weight with respect to 28 parts by weight of the reducing solvent. When the capping agent is included below 0.05 parts by weight, the diameter of the metal nanowire may increase. When the capping agent is included above 1.0 parts by weight, the length of the metal nanowire may largely decrease. The capping agent may be included by 0.05 to 0.5 parts by weight with respect to 28 parts by weight of the reducing solvent.

The catalyst is a salt additive including a cation and an anion bonded to each other through an ionic bond. The catalyst is separated to ions in the polar solvent such as water, an alcohol, a diol, and a polyol. In this instance, a cation may be an organic material or an inorganic material, and an anion may be generally an inorganic material and has a halogen ion ($Cl^-$, $Br^-$, $F^-$, or so on). Anisotropy nano structures are firstly grown by the catalyst, thereby obtaining the nanowire with a relatively high yield.

The catalyst may include at least one of a compound where a cation and an anion bonded to each other through an ionic bond and a hydrate thereof. The cation may be a cation of Al, $NH_4$, Sb, As, Ba, Bi, Cd, Ca, Cr, Co, Cu, Fe, H, Pb, Mg, Hg, Ni, K, Ag, Na, Sr, and/or Zn. The anion may be an anion of $C_2H_3O_2$, Br, $CO_3$, Cl, $CrO_4$, OH, I, $NO_3$, O, $C_2O_4$, $PO_4$, $SIO_3$, $SO_4$, S, and/or $SO_3$.

A molar concentration of the catalyst may be in a range of $10^{-5}$ mol/l to $10^{-2}$ mol/l. When the molar concentration is below $10^{-5}$ mol/l, the generation of the metal nanowire may be declined by a reduction of an initial nucleation. When the molar concentration is above $10^{-2}$ mol/l, a macro-aggregation may be induced or the surplus catalyst prevents an anisotropic growth of the metal nanowire, the diameter increases, and a generation of spherical particles may increase.

In the step S21 of synthesizing the metal nanowire, the prepared reaction mixture is reacted in the reaction container. Then, the crystal grows to the metal nanowire through reducing the metal cation and growing crystals from metal nucleation sites through the metal cation. By controlling the reaction temperature and the reaction time as well as the composition of the reaction mixture, the metal nanowire having different diameters with a large diameter and a large aspect ratio is synthesized. According to reaction conditions, the diameter, the length, and properties related the different diameters of the synthesized metal nanowire can be controlled.

The reaction temperature of the step of synthesizing the metal nanowire may in a range of 110 to 150° C. When the reaction temperature is below 110° C., the time for synthesizing the metal nanowire may increase, an output may decreases. When the reaction temperature is above 150° C., the metal nanowire may be aggregated by an increase of the rapid reaction velocity.

The reaction time of the step of synthesizing the metal nanowire may be in a range of 3 to 12 hours. When the reaction time is below 3, the grown time of the nanowire may be not sufficient and the length may be small. When the reaction time is above 12, the nanowires may be aggregated by an overproduction.

In the step of synthesizing the metal nanowire, all materials of a reaction mixture are added to a reaction container and a synthesized reaction is performed at a pressure of an atmospheric pressure or a pressure high than the atmospheric pressure to synthesize the metal nanowire. By using an increased pressure, an evaporation point increases, and thus, the volatilization of the reaction solution can be minimized and a composition of the reaction solution can be maintained. Accordingly, the length of the metal nanowire according to the embodiment is 1.5 times or more the conventional metal nanowire. For increasing the pressure, the reaction container may be sealed, or an inert gas may be injected in the reaction container.

If the composition of the reaction mixture is changed when the metal nanowire is synthesized, the length of the synthesized metal nanowire may be varied. When the reaction is generated in the state that the reaction container is sealed, inflow and outflow of substances can be prevented during the reaction, and the constant composition can be maintained. Accordingly, the metal nanowires having uniform lengths can be obtained.

Additives may be added to synthesize the metal nanowire as necessary. For example, a stabilizer such as an antioxidant and so on, a dispersant, a viscosity increasing agent or a thickener, and so on may be further added, however, the embodiment is not limited. For example, so the length of the metal nanowire can be large, HCl or $HNO_3$ may be included in an amount of 0.1 to 1 parts by weight with respect to all catalysts contained.

The metal nanowire is cooled to a room temperature after the step of synthesizing the metal nanowire, and is cleaned by acetone, ethanol, so on, and then, is purified. Accordingly, the metal nanowire having different diameters with a large diameter and a large aspect ratio can be obtained.

By decreasing the amount of the capping agent and increasing the reaction time compared with the conventional polyol synthesizing method, the capping agent for preventing a growth of side-surfaces of the metal nanowire is sufficient and the first wire portion or part having the first diameter is formed in the beginning of the synthesizing reaction. And then, the growth from the first wire portion or part is continuously generated. Then, in the end of the synthesizing reaction, the amount of the capping agent decrease and the growth of the side-surfaces of the metal nanowire increases, and therefore, a diameter of the metal nanowire increases and thus the second wire portion or part having the second diameter is formed. Accordingly, the metal nanowire including the first wire portion or part and a second wire portion or part extended from the first wire portion or part can be synthesized.

When the metal nanowire is manufactured by a manufacturing method according to an embodiment of the invention, the metal nanowire including wire portions having at least one bent portion, as well as the metal nanowire having different diameters, can be synthesized.

3) A Method for Manufacturing a Core-Shell Nanowire Having a Metal Coating

A method for manufacturing a core-shell nanowire having a metal-compound shell according to an embodiment of the invention includes a step of preparing a nanowire core on a substrate, a step of contacting the nanowire core with a precursor solution for forming a metal-compound shell, and a step of forming a metal-compound shell on the nanowire core by providing growth energy. An absorption ratio of the growth energy to the nanowire core is higher than an absorption ratio of the growth energy to the substrate. After the step of forming the metal-compound shell, a step of cleaning and nitrogen-drying may be further performed.

First, a nanowire core is prepared on a substrate. The nanowire core may be formed by directly growing the nanowire core on the substrate. Selectively, the metal nanowire may prepared by coating the metal nanowire synthesized by the manufacturing method according to the embodiment of the invention on the substrate. The substrate is not limited. For example, the substrate may be a transparent substrate. Also, the substrate may be a substrate providing with an additional layer such as a conductive file or a conductive pattern.

Next, the nanowire core is contacted with a precursor solution for forming the metal-compound shell. The contacting methods may be varied. For example, the precursor solution may be coated on with the nanowire core on the substrate. Then, the precursor solution may be uniformly and sufficiently contacted to the nanowire core.

The precursor solution may be distilled water. However, the embodiment is not limited thereto. The precursor solution includes a metal organic compound or its derivatives that is a precursor of the metal compound. The molar concentration of the metal organic compound included in the precursor solution may be in a range of 0.0001 mol/l to 1 mol/l. However, the embodiment is not limited thereto. When the molar concentration of the metal organic compound is below 0.0001 mol/l, the protruded structures may be not sufficient. When the molar concentration of the metal organic compound is above 1 mol/l, the metal compound may be unnecessarily coated on the substrate.

The precursor solution may further include a growth accelerating agent. A material of the growth accelerating agent is not limited. Preferably, a basic compound or an amine-based compound may be selected. For example, sodium hydroxide, potassium hydroxide, ammonia water, diphenylamine, D-Alanine, D-cysteine, monoethanolamine, monoethylenediamine, S-beta-phenylalanine, chlorophenylamine, and so on may be used. The molar concentration of the growth accelerating agent may be 0.0001 mol/l to 1 mol/l per 1 mol of the metal organic compound included in the precursor solution. When the molar concentration of the growth accelerating agent is below 0.0001 mol/l, the growth velocity is low. The molar concentration of the growth accelerating agent is above 1 mol/l, the protruded structures may be not sufficient or not compete, and the metal compound may be unnecessarily coated on the substrate.

Next, the metal-compound shell is coated on the nanowire core by providing growth energy. The metal-compound shell is formed by a reduction of a metal organic salt through the growth energy. An absorption ratio of the growth energy to the nanowire core is higher than an absorption ratio of the growth energy to the substrate may be selected in order to suppress the formation of the metal compound on the substrate. For example, the growth energy is an electromagnetic wave including at least one of ultraviolet rays, visible rays, and infrared rays. Preferably, a xenon lamp, a halogen lamp, an ultraviolet (UV) lamp, a laser lamp, and an infrared lamp may be used. By using the xenon lamp, xenon light of a range of 50 W to 1000 W may be irradiated. However, the light having an electric power larger than the range may be used according to a manufacturing area.

Selectively, energy inducing molecular vibrations may be used. Preferably, microwave energy may be used. The energy of the microwave energy may be in a range of 50 to 200 W. However, the energy larger than the range may be used according to a manufacturing area.

The time of supplying the growth energy is not limited. The time of supplying the growth energy may be in a range of 10 seconds to 5 minutes. However, the time longer than the range may be possible according to a manufacturing area.

Next, the cleaning and nitrogen-drying may be performed after the metal-compound shell is formed. Alcohol such as ethanol and so on may be used for the cleaning, and nitrogen may be used for the nitrogen-drying. However, the embodiment is not limited thereto.

Meanwhile, the nanowire core including the metal-compound shell may be manufactured without the substrate. That is, the nanowire core including the metal-compound shell can be obtained by a step of preparing a nanowire core, a step of contacting the nanowire core with a precursor solution for forming a metal-compound shell, and a step of forming a metal-compound shell on the nanowire core by providing growth energy being absorbed to the nanowire core. After the step of forming the metal-compound shell, a step of cleaning and nitrogen-drying may be further performed. In the step of contacting the nanowire core with a precursor solution, the nanowire core may be immersed or dipped into a precursor solution filled in an reaction container.

On the other hand, as shown in FIG. 14, the nanowire core including the metal-compound shell is formed by a roll-to-roll continuous process. For example, a flexible substrate is transferred by using rollers 30. The nanowire core is firstly formed on the substrate by using a nanowire sprayer 40. And then, the flexible substrate with the nanowire core passes through a dryer 50 and is dried. And then, the precursor solution for forming the metal-compound shell is coated through using a coater 60 so that the precursor can be sufficiently contacted with the nanowire core. And then, the metal-compound shell is coated on the nanowire core by supplying the growth energy through an energy irradiator 70 for applying growth energy. And then, the cleaning and drying is performed by a cleaning and drying apparatus 80, and thus, the substrate coated with the core-shell nanowire including the metal-compound shell can be finally manufactured by the roll-to-roll process.

(3) A Transparent Electrode and an Organic Light Emitting Diode

A transparent electrode and an organic light emitting diode using the metal nanowire or the core-shell nanowire according to an embodiment of the invention are provided. It will be understood that when one element such as a layer, a film, a region or a plate is referred to as being "on" another element, the one element may be directly on the another element, and one or more intervening elements may also be present.

The transparent electrode according to the embodiment of the invention includes a conductor layer provided on a transparent substrate and a transparent electrode layer formed on the conductor layer. The conductor layer may include a metal (or core-shell) nanowire according to the embodiment of the invention and metal particles or metal oxide particles.

For the nanowire included in the conductor layer, the metal (or core-shell) nanowire having the above properties, that is, the metal (or core-shell) nanowire having at least one of bent portion, the metal (or core-shell) nanowire having different diameters, and the core-shell nanowire having the metal coating may be used. The metal (or core-shell) nanowire manufactured by the above-mentioned manufacturing methods may be used.

The metal particle or the metal oxide included in the conductor layer has one or more of conductive materials. For example, the metal particle or the metal oxide particle may include at one selected from a group consisting of silver (Ag), gold (Au), copper (Cu), platinum (Pt), iron (Fe), nickel (Ni), cobalt (Co), zinc (Zn), titanium (Ti), chrome (Cr), aluminum (Al), palladium (Pd), and oxides thereof. However, the embodiment is not limited.

Preferably, silver (Ag) may be used. The silver (Ag) is a metal, and thus, reflects a light. Also, although the silver has low transmittance is low, when the silver faces a second electrode (for example, an aluminum metal electrode) in the organic light emitting diode, and the light can be reflected between the silver and the second electrode, and thus, the light loss can be reduced inside the organic light emitting diode.

The transparent substrate may be formed of a material or a mixture including the material. The material may be selected from a group consisting of polyester-based resins including as polyethyleneterephthalate (PET), polybuthyleneterephthalate (PBT), polyarylate, polysulfone-based resins including polysulfone and polyethersulfone (PES), polyetherketone-based resins including polyetherketone (PEK) and polyetheretherketone (PEEK), polycarbonate-based resins, polyolefin acrylic resins, styrene-based resins, cellulose derivatives including cellulose triacetate (TAC), and copolymers thereof.

Also, a transparent substrate may be a silicon substrate, a SOI(Silicon On Insulator) substrate, a gallium arsenide (GaAs) substrate, a silicon germanium(SiGe) substrate, a ceramic substrate, a quartz substrate, or a glass substrate for lighting. The substrate used for lighting may be unlimitedly used.

One or more of various transparent and conductive materials may be used for the transparent electrode layer. Preferably, one or more or metal oxides including ITO(indium tin oxide), ATO(antimony tin oxide), IZO(indium zinc oxide), AZO(ZnO—$Al_2O_3$, aluminum-doped zinc oxide), GZO(ZnO—$Ga_2O_3$, Gallium-doped zinc oxide) and graphene, which has a high transmittance, a high conductivity, and a high heat resistance, may be used for the transparent electrode layer.

The transparent electrode layer may be evenly formed on the conductor layer or formed on the conductor layer with a curve. In the case that the transparent electrode layer is formed with the curve, when a period of the curvature is R$\lambda$a and a height of the curvature is Ra, a ratio of Ra/R$\lambda$a (that is, a ratio of the height Ra of the curvature with respect to the period R$\lambda$a of the curvature) may be $10^{-3}$ or more. The transparent electrode layer can increase the light-scattering effect, and can protect the nanowire, and the metal particle or the metal oxide particle.

Also, the organic light emitting diode according to the embodiment includes a first electrode, a second electrode, and an organic light emitting layer between the first electrode and the second electrode.

The first electrode may be a transparent electrode including the metal (or core-shell) nanowire with a large diameter and a large aspect ratio according to embodiments.

The organic light emitting layer is provided between the first electrode and the second electrode, and emits the light by an electric drive between the first electrode and the second electrode. The organic light emitting layer has a stacked structure including a light emitting layer and further including at least one selected from a hole injection layer, a hole transfer layer, an electrode transfer layer, and an electrode injection layer. A material of the light emitting layer being able to emit light of a visible light range by receiving holes supplied from the hole transfer layer and electrons supplied from the electron transfer layer combining the holes and the electrodes may be used. A material having high quantum efficiency to a fluorescence material or a phosphorescent material may be preferable.

The second electrode is a reflective electrode. The second electrode may be formed of one or more of an alkali metal, an alkali earth metal, and metals of groups 3 of the periodic table of the elements. That is, the second electrode may be formed of silver (Ag), magnesium (Mg), aluminum, (Al), platinum (Pt), palladium (Pd), gold (Au), nickel (Ni), neodymium (Nd), iridium (Ir), chrome (Cr), lithium (Li) or calcium (Ca), or an alloy thereof. However, the invention is not limited thereto.

Also, according to an embodiment, an organic light emitting device includes the organic light emitting diode and a sealing substrate. The organic light emitting diode includes the transparent substrate, the first electrode according to the embodiment, the second electrode facing the first electrode, and the organic light emitting layer provided between the first electrode and the second electrode.

The sealing substrate is provided on the second electrode to cover the organic light emitting diode on the organic light emitting diode. The sealing substrate prevents oxygen and water from penetrating through the organic light emitting diode and protects the organic light emitting diode.

In the organic light emitting diode used for lighting, inner light extraction efficiency is very important. The transparent electrode according to the embodiment includes the metal (or core-shell) the nanowire according to the embodiment, and thus, the electric conductivity can increase, and the transmittance and the haze are superior. Also, a loss that may be induced by a total reflection of the light generated in the organic light emitting diode due to the reflective index can be reduced, and scattering is induced. Accordingly, the organic light emitting diode and the organic light emitting diode can have the enhanced inner light extraction effect.

For example, the transparent electrode has a sheet resistance of 50Ω/☐ or less.

Advantageous Effects

A metal nanowire according to the invention has a large diameter and a large aspect ratio and includes a plurality of wire portions having at least one bent portion. Thus, contact points, contact areas, or a contact probability between the metal nanowires can increase, a sheet resistance can be relatively low, an electric conductivity can be superior, and a light-scattering effect can be achieved.

Also, a metal nanowire according to the invention has a large diameter and a large aspect ratio and having different diameters. Thus, contact points, contact areas, or a contact probability between the metal nanowires can increase, a sheet resistance can be relatively low, an electric conductivity can be superior, and a light-scattering effect can be achieved.

In addition, a core-shell nanowire according to the invention has a metal coating. A sulfidation and an oxidation can be prevented and reliability can be enhanced. A light-scattering property can be enhanced, and a high haze can be achieved without largely reducing an electric conductivity and a transmittance.

Furthermore, a method for manufacturing a metal nanowire according the invention is an one-pot synthesis. In the method for manufacturing the metal nanowire, a purification of intermediate products is not necessary, and the metal nanowire can be manufactured with a high yield without by-products other than the metal nanowire.

Also, in a method for manufacturing a metal nanowire according to the invention, volatilization of a reaction mixture can be minimized by adding all of a reaction mixture to a reaction container and reacting with the reaction mixture at a pressure of an atmospheric pressure or a pressure high than the atmospheric pressure. The metal nanowire can be grown to be bent, not to be broken, even the metal nanowire has a large diameter and a large aspect ratio. Thus, the metal nanowire including a plurality of wire portions having at least one bent portion can be manufactured.

Further, in a method for manufacturing a metal nanowire according to the invention, a side-surface growth of the metal nanowire can be controlled by controlling an amount of a capping agent, and the metal nanowire having different diameters can be manufactured.

In addition, a method for manufacturing a core-shell nanowire according to the invention can be applied to a metal nanowire including a plurality of wire portions having at least one bent portion and a metal nanowire having different diameters, as well as the known, marketed, or generally used metal nanowire. Thus, a core-shell nanowire having a metal-compound shell can be manufactured.

Furthermore, according to a method for manufacturing a transparent electrode and an organic light emitting diode including a metal nanowire having a large diameter and a large aspect ratio and including a plurality of wire portions having at least one bent portion as a conductor layer, the transparent electrode having a transmittance and a haze suitable for an OLED lighting or an organic solar cell at a range of visibly ray can be manufactured.

Also, according to a method for manufacturing a transparent electrode and an organic light emitting diode including a metal nanowire having a large diameter and a large aspect ratio and having different diameters as a conductor layer, the transparent electrode having a transmittance and a haze suitable for an OLED lighting or an organic solar cell at a range of visibly ray can be manufactured.

Furthermore, according to a method for manufacturing a transparent electrode and an organic light emitting diode including a core-shell nanowire having a metal coating, a sulfidation and an oxidation can be prevented and reliability can be enhanced. A light-scattering property can be enhanced, and a high haze can be achieved without largely reducing an electric conductivity and a transmittance.

Embodiment

1) Embodiment 1 to Embodiment 10—A Metal Nanowire Including a Plurality of Wire Portions Having at Least One Bent Portion Embodiment 1

A reaction mixture was prepared by mixing 0.1 mol/l of $AgNO_3$, 28 g of EG(99.5%), 3 g of PVP(Mw ~360,000), and $1 \times 10^{-3}$ mol/l of $FeCl_3$. The reaction mixture was added into a single container and the single container was sealed, and then, a reaction was generated at 1 atm and 130° C. for 5 hours, thereby obtaining silver nanowires including wire portions having at least one bent portion.

Embodiment 2

A reaction mixture was prepared by mixing 0.1 mol/l of $AgNO_3$, 28 g of EG(99.5%), 3 g of PVP(Mw ~360,000), and $1 \times 10^{-3}$ mol/l of $FeCl_3$. The reaction mixture was added into a single container and the single container was sealed, and then, a reaction was generated at 3 atm and 130° C. for 5 hours, thereby obtaining silver nanowires including wire portions having at least one bent portion.

Embodiment 3

A reaction mixture was prepared by mixing 0.1 mol/l of $AgNO_3$, 28 g of EG(99.5%), 3 g of PVP(Mw ~360,000), and $1 \times 10^{-3}$ mol/l of $FeCl_3$. The reaction mixture was added into a single container and the single container was sealed, and then, a reaction was generated at 5 atm and 130° C. for 5 hours, thereby obtaining silver nanowires including wire portions having at least one bent portion.

Embodiment 4

Silver nanowires including wire portions having at least one bent portion were obtained by the same method according to Embodiment 2, except that the molar concentration of $FeCl_3$ was $5 \times 10^{-3}$ mol/l and the reaction time is 1 hour.

Embodiment 5

Silver nanowires having wire portion having at least one bent portion were obtained by the same method according to Embodiment 2, except that the molar concentration of $FeCl_3$ was $5 \times 10^{-3}$ mol/l and the reaction time is 6 hours.

Embodiment 6

Silver nanowires including wire portions having at least one bent portion were obtained by the same method according to Embodiment 2, except that the molar concentration of $FeCl_3$ was $5 \times 10^{-3}$ mol/l and the reaction time is 12 hours.

Embodiment 7

Silver nanowires having at least one bent portion and having different diameters were obtained by the same method according to Embodiment 2, except that the reaction temperature was 110° C.

Embodiment 8

Silver nanowires having at least one bent portion and having different diameters were obtained by the same method according to Embodiment 2, except that the reaction temperature was 150° C.

Embodiment 9

Silver nanowires having at least one bent portion and having different diameters were obtained by the same method according to Embodiment 2, except that an amount of the PVP(Mw ~360,000) was 0.8 g.

Embodiment 10

Silver nanowires having at least one bent portion and having different diameters were obtained by the same method according to Embodiment 2, except that an amount of the PVP(Mw ~360,000) was 1.5 g.

2) Embodiment 11 to Embodiment 22—a Metal Nanowire Including Having Different Diameters Embodiment 11

A reaction mixture was prepared by mixing 0.2 mol/l of $AgNO_3$, 28 g of EG(99.5%), 0.1 g of PVP(Mw ~360,000), and $1 \times 10^{-3}$ mol/l of $FeCl_3$. The reaction mixture was added into a single container and the single container was sealed, and then, a reaction was generated at 1 atm and 130° C. for 3 hours, thereby obtaining silver nanowires having different diameters.

Embodiment 12

Silver nanowires including wire portions having different diameters were obtained by the same method according to Embodiment 11, except that reaction time is 4 hours.

Embodiment 13

Silver nanowires including wire portions having different diameters were obtained by the same method according to Embodiment 11, except that reaction time is 5 hours.

Embodiment 14

Silver nanowires including wire portions having different diameters were obtained by the same method according to Embodiment 11, except that reaction time is 6 hours.

Embodiment 15

Silver nanowires including wire portions having different diameters were obtained by the same method according to Embodiment 11, except that reaction time is 7 hours.

Embodiment 16

A reaction mixture was prepared by mixing 0.1 mol/l of $AgNO_3$, 28 g of EG(99.5%), 0.05 g of PVP(Mw ~360,000), and $5 \times 10^{-3}$ mol/l of $FeCl_3$. The reaction mixture was added into a single container and the single container was sealed, and then, a reaction was generated at 3 atm and 130° C. for 3 hours, thereby obtaining silver nanowires having different diameters.

Embodiment 17

Silver nanowires including wire portions having different diameters were obtained by the same method according to Embodiment 11, except that reaction time is 4 hours.

Embodiment 18

Silver nanowires including wire portions having different diameters were obtained by the same method according to Embodiment 16, except that reaction time is 5 hours.

Embodiment 19

Silver nanowires including wire portions having different diameters were obtained by the same method according to Embodiment 16, except that reaction time is 6 hours.

Embodiment 20

Silver nanowires including wire portions having different diameters were obtained by the same method according to Embodiment 16, except that reaction time is 7 hours.

Embodiment 21

A reaction mixture was prepared by mixing 0.1 mol/l of $AgNO_3$, 28 g of EG(99.5%), 0.1 g of PVP(Mw ~360,000), and $1\times10^{-3}$ mol/l of $FeCl_3$. The reaction mixture was added into a single container and the single container was sealed, and then, a reaction was generated at 3 atm and 110° C. for 12 hours, thereby obtaining silver nanowires having different diameters and having at least one bent portion.

Embodiment 22

A reaction mixture was prepared by mixing 0.1 mol/l of $AgNO_3$, 28 g of EG(99.5%), 0.05 g of PVP(Mw ~360,000), and $1\times10^{-3}$ mol/l of $FeCl_3$. The reaction mixture was added into a single container and the single container was sealed, and then, a reaction was generated at 3 atm and 150° C. for 12 hours, thereby obtaining silver nanowires having different diameters and having at least one bent portion.

3) Comparative Example 1 to Comparative Example 7

Comparative Example 1

A reaction mixture was prepared by mixing 0.1 mol/l of $AgNO_3$, 28 g of EG(99.5%), 3 g of PVP(Mw ~360,000), and $1\times10^{-3}$ mol/l of $FeCl_3$. The reaction mixture was added into a single container and the single container was not sealed, and then, a reaction was generated at 1 atm and 130° C. for 5 hours, thereby obtaining silver nanowires.

Comparative Example 2

A reaction mixture was prepared by mixing 0.15 mol/l of $AgNO_3$, 28 g of EG(99.5%), 3 g of PVP(Mw ~360,000), and $1\times10^{-3}$ mol/l of $FeCl_3$. The reaction mixture was added into a single container and the single container was not sealed, and then, a reaction was generated at 1 atm and 130° C. for 5 hours, thereby obtaining silver nanowires.

Comparative Example 3

A reaction mixture was prepared by mixing 0.1 mol/l of $AgNO_3$, 28 g of EG(99.5%), 3 g of PVP(Mw ~360,000), and $1\times10^{-5}$ mol/l of $FeCl_3$. The reaction mixture was added into a single container and the single container was not sealed, and then, a reaction was generated at 3 atm and 130° C. for 5 hours, thereby obtaining silver nanowires.

Comparative Example 4

A reaction mixture was prepared by mixing 0.1 mol/l of $AgNO_3$, 28 g of EG(99.5%), 3 g of PVP(Mw ~360,000), and $5\times10^{-5}$ mol/l of $FeCl_3$. The reaction mixture was added into a single container and the single container was not sealed, and then, a reaction was generated at 3 atm and 130° C. for 5 hours, thereby obtaining silver nanowires.

Comparative Example 5

A reaction mixture was prepared by mixing 0.1 mol/l of $AgNO_3$, 28 g of EG(99.5%), 3 g of PVP(Mw ~360,000), and $1\times10^{-4}$ mol/l of $FeCl_3$. The reaction mixture was added into a single container and the single container was not sealed, and then, a reaction was generated at 3 atm and 130° C. for 5 hours, thereby obtaining silver nanowires.

Comparative Example 6

A reaction mixture was prepared by mixing 0.1 mol/l of $AgNO_3$, 28 g of EG(99.5%), 0.5 g of PVP(Mw ~360,000), and $1\times10^{-3}$ mol/l of $FeCl_3$. The reaction mixture was added into a single container and the single container was sealed, and then, a reaction was generated at 3 atm and 130° C. for 2 hours, thereby obtaining silver nanowires.

Comparative Example 7

A reaction mixture was prepared by mixing 0.1 mol/l of $AgNO_3$, 28 g of EG(99.5%), 1 g of PVP(Mw ~360,000), and $1\times10^{-3}$ mol/l of $FeCl_3$. The reaction mixture was added into a single container and the single container was sealed, and then, a reaction was generated at 3 atm and 130° C. for 1 hour, thereby obtaining silver nanowires.

TABLE 1

| | amount or concentration of Preparing a reaction mixture | | | | Reaction conditions of Synthesizing silver nanowires | | | Seal [○] |
| --- | --- | --- | --- | --- | --- | --- | --- | --- |
| | M.S [mol/l] | R.S [g] | C.A [g] | C [mol/l] | P [atm] | T [hr] | Temp [° C.] | or not-seal [X] |
| Embodiment 1 | 0.1 | 28 | 3 | $1\times10^{-3}$ | 1 | 5 | 130 | ○ |
| Embodiment 2 | 0.1 | 28 | 3 | $1\times10^{-3}$ | 3 | 5 | 130 | ○ |
| Embodiment 3 | 0.1 | 28 | 3 | $1\times10^{-3}$ | 5 | 5 | 130 | ○ |
| Embodiment 4 | 0.1 | 28 | 3 | $5\times10^{-3}$ | 3 | 1 | 130 | ○ |
| Embodiment 5 | 0.1 | 28 | 3 | $5\times10^{-3}$ | 3 | 6 | 130 | ○ |
| Embodiment 6 | 0.1 | 28 | 3 | $5\times10^{-3}$ | 3 | 12 | 130 | ○ |

TABLE 1-continued

|  | amount or concentration of Preparing a reaction mixture | | | | Reaction conditions of Synthesizing silver nanowires | | | Seal [○] |
| --- | --- | --- | --- | --- | --- | --- | --- | --- |
|  | M.S [mol/l] | R.S [g] | C.A [g] | C [mol/l] | P [atm] | T [hr] | Temp [° C.] | or not-seal [X] |
| Embodiment 7 | 0.1 | 28 | 3 | $1 \times 10^{-3}$ | 3 | 5 | 110 | ○ |
| Embodiment 8 | 0.1 | 28 | 3 | $1 \times 10^{-3}$ | 3 | 5 | 150 | ○ |
| Embodiment 9 | 0.1 | 28 | 0.8 | $1 \times 10^{-3}$ | 3 | 5 | 130 | ○ |
| Embodiment 10 | 0.1 | 28 | 1.5 | $1 \times 10^{-3}$ | 3 | 5 | 130 | ○ |
| Embodiment 11 | 0.2 | 28 | 0.1 | $1 \times 10^{-3}$ | 1 | 3 | 130 | ○ |
| Embodiment 12 | 0.2 | 28 | 0.1 | $1 \times 10^{-3}$ | 1 | 4 | 130 | ○ |
| Embodiment 13 | 0.2 | 28 | 0.1 | $1 \times 10^{-3}$ | 1 | 5 | 130 | ○ |
| Embodiment 14 | 0.2 | 28 | 0.1 | $1 \times 10^{-3}$ | 1 | 6 | 130 | ○ |
| Embodiment 15 | 0.2 | 28 | 0.1 | $1 \times 10^{-3}$ | 1 | 7 | 130 | ○ |
| Embodiment 16 | 0.1 | 28 | 0.05 | $5 \times 10^{-3}$ | 3 | 3 | 130 | ○ |
| Embodiment 17 | 0.1 | 28 | 0.05 | $5 \times 10^{-3}$ | 3 | 4 | 130 | ○ |
| Embodiment 18 | 0.1 | 28 | 0.05 | $5 \times 10^{-3}$ | 3 | 5 | 130 | ○ |
| Embodiment 19 | 0.1 | 28 | 0.05 | $5 \times 10^{-3}$ | 3 | 6 | 130 | ○ |
| Embodiment 20 | 0.1 | 28 | 0.05 | $5 \times 10^{-3}$ | 3 | 7 | 130 | ○ |
| Embodiment 21 | 0.1 | 28 | 0.1 | $1 \times 10^{-3}$ | 3 | 12 | 110 | ○ |
| Embodiment 22 | 0.1 | 28 | 0.05 | $1 \times 10^{-3}$ | 3 | 12 | 150 | ○ |
| Comparative Example 1 | 0.1 | 28 | 3 | $1 \times 10^{-3}$ | 1 | 5 | 130 | X |
| Comparative Example 2 | 0.15 | 28 | 3 | $1 \times 10^{-3}$ | 1 | 5 | 130 | X |
| Comparative Example 3 | 0.1 | 28 | 3 | $1 \times 10^{-5}$ | 3 | 5 | 130 | X |
| Comparative Example 4 | 0.1 | 28 | 3 | $5 \times 10^{-5}$ | 3 | 5 | 130 | X |
| Comparative Example 5 | 0.1 | 28 | 3 | $1 \times 10^{-4}$ | 3 | 5 | 130 | X |
| Comparative Example 6 | 0.1 | 28 | 0.5 | $1 \times 10^{-3}$ | 3 | 2 | 130 | ○ |
| Comparative Example 7 | 0.1 | 28 | 1 | $1 \times 10^{-3}$ | 3 | 1 | 130 | ○ |

[M.S: a metal salt, R.S: a reducing solution, C.A: a capping agent, C: catalyst, P: pressure, T: time, Temp: Temperature]

4) Embodiment 23 to Embodiment 32—A Core-Shell Nanowire Having a Metal Coating

Embodiment 23

0.001 mol/l of zinc acetate dehydrate and 0.001 mol/l hexamethylenedimaine were added to distilled water to prepare a precursor solution. And then, the precursor solution was coated on a substrate coated with silver nanowires. And then, light was irradiated to the substrate by using a white light source for 5 minutes. After the completion of the reaction, the substrate was washed by using ethanol and was dried by using nitrogen, and thus, the core-shell nanowires were manufactured.

Embodiment 24

Core-shell nanowires were manufactured by the same method according to Embodiment 23, except that the molar concentration of the zinc acetate dehydrate was 0.01 mol/l and the amount of the hexamethylenediamine was 0.01 mol/l.

Embodiment 25

Core-shell nanowires were manufactured by the same method according to Embodiment 23, except that the molar concentration of the zinc acetate dehydrate was 0.10 mol/l and the amount of the hexamethylenediamine was 0.10 mol/l.

Embodiment 26

Core-shell nanowires were manufactured by the same method according to Embodiment 23, except that the molar concentration of the zinc acetate dehydrate was 0.50 mol/l and the amount of the hexamethylenediamine was 0.50 mol/l.

Embodiment 27

Core-shell nanowires were manufactured by the same method according to Embodiment 23, except that the molar concentration of the zinc acetate dehydrate was 1.00 mol/l and the amount of the hexamethylenediamine was 1.00 mol/l.

Embodiment 28

0.001 mol/l of zinc nitrate and 0.001 mol/l hexamethylenedimaine were added to distilled water to prepare a precursor solution. And then, the precursor solution was coated on a substrate coated with the silver nanowires. And then, microwave of 1000 W is applied for 30 seconds. After the completion of the reaction, the substrate was washed by using ethanol and was dried by using nitrogen, and thus, the core-shell nanowires were manufactured.

Embodiment 29

Core-shell nanowires were manufactured by the same method according to Embodiment 28, except that the molar concentration of the zinc nitrate was 0.01 mol/l and the amount of the hexamethylenediamine was 0.01 mol/l.

Embodiment 30

Core-shell nanowires were manufactured by the same method according to Embodiment 28, except that the molar concentration of the zinc nitrate was 0.10 mol/l and the amount of the hexamethylenediamine was 0.10 mol/l.

Embodiment 31

Core-shell nanowires were manufactured by the same method according to Embodiment 28, except that the molar concentration of the zinc nitrate was 0.50 mol/l and the amount of the hexamethylenediamine was 0.50 mol/l.

Embodiment 32

Core-shell nanowires were manufactured by the same method according to Embodiment 28, except that the molar concentration of the zinc nitrate was 1.00 mol/l and the amount of the hexamethylenediamine was 1.00 mol/l.

Comparative Example 8 to Comparative Example 12

The substrates coated with the silver nanowires according Embodiment 23 to Embodiment 27 before a zinc oxide coating, which were not coated with a zinc oxide, were used as the Comparative Example 8 to Comparative Example 12, respectively.

Comparative Example 13 to Comparative Example 17

The substrates coated with the silver nanowires according Embodiment 28 to Embodiment 32 before a zinc oxide coating, which were not coated with a zinc oxide, were used as the Comparative Example 13 to Comparative Example 17, respectively.

Test Example

1) Measuring a Diameter and a Length, and Calculating an Aspect Ratio

The diameters and the lengths of the silver nanowires synthesized according to Embodiments and Comparative Examples were measured, and the aspect ratios were calculated. The result are shown in TABLE 2.

TABLE 2

|  | $1^{st}$ diameter[nm] | $2^{nd}$ diameter[um] | $3^{rd}$ diameter[m] | Length [m] | Aspect ratio |
|---|---|---|---|---|---|
| Embodiment 1 | 80 |  |  | 100 | 1250 |
| Embodiment 2 | 100 |  |  | 150 | 1500 |
| Embodiment 3 | 120 |  |  | 230 | 1917 |
| Embodiment 4 | 60 |  |  | 60 | 1000 |
| Embodiment 5 | 150 |  |  | 120 | 800 |
| Embodiment 6 | 200 |  |  | 230 | 1150 |
| Embodiment 7 | 90 | 0.3-0.9 | 0.2-0.6 | 100 | 1111 |
| Embodiment 8 | 150 | 0.4-1.2 | 0.4-1.0 | 130 | 867 |
| Embodiment 9 | 200 |  |  | 100 | 500 |
| Embodiment 10 | 150 |  |  | 100 | 667 |
| Embodiment 11 | 50 | 0.01-0.1 |  | 70 | 1400 |
| Embodiment 12 | 60 | 0.02-0.13 |  | 100 | 1667 |
| Embodiment 13 | 80 | 0.03-0.15 |  | 140 | 1750 |
| Embodiment 14 | 80 | 0.025-0.2 | 0.025-0.1 | 150 | 1875 |
| Embodiment 15 | 90 | 0.1-0.3 | 0.1-0.3 | 160 | 1778 |
| Embodiment 16 | 60 | 0.03-0.1 |  | 50 | 833 |
| Embodiment 17 | 70 | 0.06-0.2 |  | 70 | 1000 |
| Embodiment 18 | 80 | 0.1-0.2 | 0.08-0.15 | 100 | 1250 |
| Embodiment 19 | 100 | 0.15-0.35 | 0.08-0.2 | 120 | 1200 |
| Embodiment 20 | 130 | 0.2-0.5 | 0.1-0.5 | 150 | 1154 |
| Embodiment 21 | 90 | 0.3-0.9 | 0.2-0.6 | 100 | 1111 |
| Embodiment 22 | 150 | 0.4-1.2 | 0.4-1.0 | 130 | 867 |
| Comparative Example 1 | 60 |  |  | 40 | 667 |
| Comparative Example 2 | 80 |  |  | 40 | 500 |
| Comparative Example 3 | 50 |  |  | 15 | 300 |
| Comparative Example 4 | 55 |  |  | 20 | 364 |
| Comparative Example 5 | 60 |  |  | 30 | 500 |
| Comparative Example 6 | 150 |  |  | 30 | 200 |
| Comparative Example 7 | 100 |  |  | 30 | 300 |

As shown in TABLE 2, it can be seen that the silver nanowires according to Embodiments have diameters and lengths larger than diameters and lengths of the silver nanowires according to Comparative Examples. Also, it can be seen that the aspect ratios of the silver nanowires according to Embodiments are generally above 1000.

Also, the silver nanowires according to Embodiment 7, 8 and Embodiment 11 to 22 have a plurality of diameters having a second diameter, a third diameter, and so on. On the other hand, each of the silver nanowires according to Comparative Examples has a uniform diameter.

2) Analysis of a Scanning Electron Microscopy (SEM)

FIG. 15 is a photograph of a surface of silver nanowires according to an embodiment of the invention, taken using a scanning electron microscopy. As shown in FIG. 15, the manufactured silver nanowires have a diameter distribution 15a of D1 (124.47 nm), D2 (81.48 nm), D3 (84.42 nm), D4 (85.93 nm), D5 (84.65 nm), D6 (98.13 nm), D7 (134.80 nm), and D8 (67.15 nm). That is, the silver nanowires have large diameters. Also, the manufactured silver nanowires have a length distribution 15b of D1 (194.79 μm), D2 (182.86 μm), D3 (100.14 μm), D4 (193.74 μm), D5 (111.31 μm), D6 (243.61 μm), D7 (95.14 μm), and D8 (123.00 μm). That is, the silver wires have large lengths.

FIG. 16 is a photograph of silver nanowires having a plurality of wire parts having different diameters according to an embodiment of the invention, taken using a scanning electron microscopy. As shown in FIG. 16, it can be seen that a second part having the second diameter connected to a first part having a first diameter is formed.

3) Analysis Using Transmission Electron Microscope (TEM)

FIG. 17 and FIG. 18 are photographs of silver nanowires including a plurality of wire portions having at least one bent portion according to an embodiment of the invention, taken using a transmission electron microscopy. The silver nanowires having bent shapes bent to a predetermined direction can be seen. FIG. 19 is a photograph of silver nanowires not including a plurality of wire portions and not having at least one bent portion as a comparative example, taken using a transmission electron microscopy.

The number of the bent portion an and average angle of the bent portion of the silver nanowires including the plurality of wire portion having at least one bent portion are shown in TABLE 3.

As shown in TABLE 3, it can be seen that the silver nanowires according to Embodiments generally include two to three bent portions, while the silver nanowires according to Comparative Examples do not include the bent portion. Also, it can be seen that the nanowires according to Embodiments 21 and 22 have different diameters and have at least one bent portion.

Experimental Example

1) Measuring Electric Conductivity (Sheet Resistance)

A sheet resistance of a transparent substrate including silver nanowires according to each Embodiments and Comparative Examples was measured 15 times by using a 4-point probe. An average sheet resistance and a standard deviation were calculated. Also, the average sheet resistance and the standard deviation are shown in TABLE 4.

TABLE 4

|  | average sheet resistance(Ω/□) | Standard deviation |
|---|---|---|
| Embodiment 1 | 25 | 7.5 |
| Embodiment 2 | 21 | 6.3 |
| Embodiment 3 | 40 | 12 |
| Embodiment 4 | 80 | 24 |
| Embodiment 5 | 82 | 24.6 |
| Embodiment 6 | 42 | 12.6 |

TABLE 3

|  | $1^{st}$ diameter [nm] | $2^{nd}$ diameter [μm] | $3^{rd}$ diameter [μm] | Length [μm] | N.B | A.B [°] |
|---|---|---|---|---|---|---|
| Embodiment 1 | 80 |  |  | 100 | 2 | 155 |
| Embodiment 2 | 100 |  |  | 150 | 2 | 110 |
| Embodiment 3 | 120 |  |  | 230 | 3 | 87 |
| Embodiment 4 | 60 |  |  | 60 | 1 | 150 |
| Embodiment 5 | 150 |  |  | 120 | 2 | 155 |
| Embodiment 6 | 200 |  |  | 230 | 2 | 160 |
| Embodiment 7 | 90 | 0.3-0.9 | 0.2-0.6 | 100 | 2 | 150 |
| Embodiment 8 | 150 | 0.4-1.2 | 0.4-1.0 | 130 | 2 | 160 |
| Embodiment 9 | 200 |  |  | 100 | 2 | 155 |
| Embodiment 10 | 150 |  |  | 100 | 2 | 155 |
| Embodiment 11 | 50 | 0.01-0.1 |  | 70 |  |  |
| Embodiment 12 | 60 | 0.02-0.13 |  | 100 |  |  |
| Embodiment 13 | 80 | 0.03-0.15 |  | 140 |  |  |
| Embodiment 14 | 80 | 0.025-0.2 | 0.025-0.1 | 150 |  |  |
| Embodiment 15 | 90 | 0.1-0.3 | 0.1-0.3 | 160 |  |  |
| Embodiment 16 | 60 | 0.03-0.1 |  | 50 |  |  |
| Embodiment 17 | 70 | 0.06-0.2 |  | 70 |  |  |
| Embodiment 18 | 80 | 0.1-0.2 | 0.08-0.15 | 100 |  |  |
| Embodiment 19 | 100 | 0.15-0.35 | 0.08-0.2 | 120 |  |  |
| Embodiment 20 | 130 | 0.2-0.5 | 0.1-0.5 | 150 |  |  |
| Embodiment 21 | 90 | 0.3-0.9 | 0.2-0.6 | 100 | 2 | 150 |
| Embodiment 22 | 150 | 0.4-1.2 | 0.4-1.0 | 130 | 2 | 160 |
| Comparative Example 1 | 60 |  |  | 40 |  |  |
| Comparative Example 2 | 80 |  |  | 40 |  |  |
| Comparative Example 3 | 50 |  |  | 15 |  |  |
| Comparative Example 4 | 55 |  |  | 20 |  |  |
| Comparative Example 5 | 60 |  |  | 30 |  |  |
| Comparative Example 6 | 150 |  |  | 30 |  |  |
| Comparative Example 7 | 100 |  |  | 30 |  |  |

[N.B: the number of the bent portions, A.B: an average angle of the bent portion]

TABLE 4-continued

| | average sheet resistance(Ω/□) | Standard deviation |
|---|---|---|
| Embodiment 7 | 27 | 8.1 |
| Embodiment 8 | 37 | 11.1 |
| Embodiment 9 | 29 | 8.7 |
| Embodiment 10 | 42 | 12.6 |
| Embodiment 11 | 108 | 20.4 |
| Embodiment 12 | 97 | 18.9 |
| Embodiment 13 | 68 | 16.7 |
| Embodiment 14 | 54 | 13.9 |
| Embodiment 15 | 40 | 12.2 |
| Embodiment 16 | 115 | 31.1 |
| Embodiment 17 | 110 | 29.7 |
| Embodiment 18 | 48 | 7.3 |
| Embodiment 19 | 43 | 9.7 |
| Embodiment 20 | 35 | 8.3 |
| Embodiment 21 | 27 | 8.1 |
| Embodiment 22 | 37 | 11.1 |
| Comparative Example 1 | 58 | 17.4 |
| Comparative Example 2 | 75 | 22.5 |
| Comparative Example 3 | 73 | 21.9 |
| Comparative Example 4 | 90 | 27 |
| Comparative Example 5 | 120 | 36 |
| Comparative Example 6 | 160 | 48 |
| Comparative Example 7 | 180 | 54 |

As shown in TABLE 4, the transparent electrodes including the silver nanowires according to Embodiments have sheet resistances of a minimum of 21Ω/□, a maximum of 115Ω/□, and an average of 54.9Ω/□. On the other hand, the transparent electrodes including the silver nanowires according to Comparative Examples have sheet resistances of a minimum of 58Ω/□, a maximum of 180Ω/□, and an average of 108Ω/□. It can be seen that the silver nanowires according to the invention can prevent the sheet resistance from increasing and thus the transparent electrode can have a superior electric conductivity.

2) Measuring a Transmittance and a Haze

A transmittance and a haze of a transparent substrate including silver nanowires according to each Embodiments and Comparative Examples were measured, and the results are shown in TABLE 5. FIG. 20 is graphs of transmittances, wherein (a) of FIG. 20 is a graph of transmittances of a transparent substrate including silver nanowires according to each of Embodiments 11 to 15, and (b) of FIG. 20 is a graph of transmittances of a transparent substrate including silver nanowires according to each of Embodiments 16 to 20. FIG. 21 is graphs of hazes, wherein (a) of FIG. 21 is a graph of a haze of a transparent substrate including silver nanowires according to each of Embodiments 11 to 15, and (b) of FIG. 21 is a graph of a haze of each of a transparent substrate including silver nanowires according to Embodiments 16 to 20.

TABLE 5

| | transmittance(%) | haze[%] |
|---|---|---|
| Embodiment 1 | 88.3 | 1.2 |
| Embodiment 2 | 88.2 | 1.5 |
| Embodiment 3 | 88.6 | 2.2 |

TABLE 5-continued

| | transmittance(%) | haze[%] |
|---|---|---|
| Embodiment 4 | 88.8 | 1.2 |
| Embodiment 5 | 88.7 | 1.8 |
| Embodiment 6 | 88.5 | 2 |
| Embodiment 7 | 87.2 | 10.2 |
| Embodiment 8 | 87.7 | 17.4 |
| Embodiment 9 | 88.3 | 1.2 |
| Embodiment 10 | 88.2 | 1.5 |
| Embodiment 11 | 86.7 | 4.5 |
| Embodiment 12 | 84 | 8.4 |
| Embodiment 13 | 85.9 | 6.1 |
| Embodiment 14 | 86.9 | 4.8 |
| Embodiment 15 | 85.8 | 6.6 |
| Embodiment 16 | 85.4 | 5.9 |
| Embodiment 17 | 83.2 | 9.1 |
| Embodiment 18 | 85.5 | 7.3 |
| Embodiment 19 | 82.1 | 11.2 |
| Embodiment 20 | 84.3 | 7.4 |
| Embodiment 21 | 87.2 | 10.2 |
| Embodiment 22 | 87.7 | 17.4 |
| Comparative Example 1 | 89.9 | 1.2 |
| Comparative Example 2 | 88.7 | 1.5 |
| Comparative Example 3 | 89.3 | 1.3 |
| Comparative Example 4 | 89.3 | 1.4 |
| Comparative Example 5 | 88.2 | 1.7 |
| Comparative Example 6 | 87.1 | 2 |
| Comparative Example 7 | 87.7 | 1.6 |

The haze may be below 1% when the transparent electrode is used for a display device. On the other hand, when the transparent electrode is used for an OLED lighting (an inner light extraction layer) or an organic solar cell, the haze of 1% or more (more particularly, 5% or more) is necessary. As shown in TABLE 5, the transmittances of the transparent electrodes including the silver nanowires according to Embodiments are similar to those according to Comparative Examples. The hazes of the transparent electrodes including the silver nanowires according to some Embodiments are similar to the those according to Comparative Examples, and the hazes of the transparent electrodes including the silver nanowires according to other Embodiments are high (for example, 10% or more). Thus, the transparent electrode can have properties suitable for an OLED lighting (an inner light extraction layer) or an organic solar cell.

3) Experimental Embodiment of Embodiments 23 to 27 and Comparative Examples 8 to 12

FIG. 22 and FIG. 23 are scanning electron microscopy photographs of core-shell nanowires according to Embodiments 23 to 27. As shown in FIG. 22 and FIG. 23, it can be seen that metal-compound shells having a plurality of stripe patterns extending in a longitudinal direction of the nanowire are formed.

Also, FIG. 24 is a photograph for illustrating that a zinc oxide is selectively coated on the nanowire formed on a core-shell nanowire substrate. As shown in FIG. 24, it can be seen that the zinc oxide is selectively coated only on the nanowire.

FIG. 25 is a graph of sheet resistances of Embodiments. It can be seen that the sheet resistances of the silver nanowires after the coating are similar to the sheet resistances of the silver nanowires before the coating. Also, in some Embodiments, it can be seen that the sheet resistances of the silver nanowires after the coating of the metal-oxide shell are higher than the sheet resistances of the silver nanowires before the coating of the metal-oxide shell.

Also, FIG. 26 is X-ray diffraction peaks of the core-shell nanowires according to Embodiments. It can be seen that there is a peak of a metal oxide and that an intensity of the peak of the metal oxide increases as a coated amount increases.

In addition, FIG. 27 to FIG. 29 are graphs of light transmittances of Embodiment 23 to Embodiment 27. It can be seen that the light transmittance can be very superior.

Further, FIG. 30 to FIG. 32 are graphs of hazes of Embodiment 23 to Embodiment 27. It can be seen that the haze largely increases as the coated amount of the metal oxide shell.

Also, FIG. 33 is a graph of a photoluminescence (PL) according to each of Embodiments 23 to 25.

In addition, FIG. 34 is a graph of a sheet resistance with respect to time, according to Embodiment 23 to Embodiment 27. It can be seen that the sheet resistance is generally maintained as the time goes.

For example, when the core-shell nanowire is coated on a transparent substrate to have a sheet resistance of 1~100 (Ω/□), a haze may be in a range of 5% or more (for example, 20% or more) at a wavelength of 550 nm. When the core-shell nanowire is coated on a transparent substrate to have a sheet resistance of 1~100(Ω/□), a light transmittance may be in a range of 60 to 98% at a wavelength of 550 nm.

4) An Exemplary Example of Embodiments 28 to 32 and Comparative Examples 13 to 17

FIG. 35 and FIG. 36 are scanning electron microscopy photographs of core-shell nanowires according to Embodiments 28 to 32. As shown in FIG. 35 and FIG. 36, it can be seen that metal-compound shells having a plurality of stripe patterns extending in a longitudinal direction of the nanowire are formed.

Also, FIG. 37 is a photograph for illustrating that a zinc oxide is selectively coated on the nanowire formed on a core-shell nanowire substrate. As shown in FIG. 37, it can be seen that the zinc oxide is selectively coated only on the nanowire.

FIG. 28 is a graph of sheet resistances of Embodiments of Comparative Examples. It can be seen that the sheet resistances of the silver nanowires after the coating are similar to the sheet resistances of the silver nanowires before the coating. Also, in some Embodiments, it can be seen that the sheet resistances of the silver nanowires after the coating of the metal-oxide shell are higher than the sheet resistances of the silver nanowires before the coating of the metal-oxide shell.

Also, FIG. 39 is X-ray diffraction peaks of the core-shell nanowires according to Embodiments. It can be seen that there is a peak of a metal oxide and that an intensity of the peak of the metal oxide increases as a coated amount increases.

Further, FIG. 40 to FIG. 42 are graphs of hazes of Embodiment 28 to Embodiment 32. It can be seen that the haze largely increases as the coated amount of the metal oxide shell.

In addition, FIG. 43 to FIG. 45 are graphs of light transmittance of Embodiment 28 to Embodiment 32. It can be seen that the light transmittance can be very superior.

Also, FIG. 46 is a graph of a photoluminescence (PL) according to each of Embodiments 28 to 32.

In addition, FIG. 47 is a graph of a sheet resistance with respect to time, according to each of Embodiment 28, 29, and 32. It can be seen that the sheet resistance is generally maintained as the time goes.

For example, when the core-shell nanowire is coated on a transparent substrate to have a sheet resistance of 1~100 (Ω/□), a haze may be in a range of 5% or more (for example, 20% or more) at a wavelength of 550 nm. When the core-shell nanowire is coated on a transparent substrate to have a sheet resistance of 1~100(Ω/□), a light transmittance may be in a range of 60 to 98% at a wavelength of 550 nm.

The above described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the invention as disclosed in the accompanying claims.

DESCRIPTION OF DRAWINGS

FIG. 1 illustrates a metal nanowire including two wire portions having a bent portion, according to an embodiment of the invention.

FIG. 2 illustrates a metal nanowire including a plurality of wire portions having at least one bent portion, according to another embodiment of the invention.

FIG. 3 illustrates a three-dimensional structure of a metal nanowire including a plurality of wire portions having at least one bent portion, according to yet another embodiment of the invention.

FIG. 4 illustrates a metal nanowire including a plurality of wire parts having different diameters, wherein the plurality of wire parts including one second wire part, according to yet still another embodiment of the invention.

FIG. 5 illustrates a metal nanowire including a plurality of wire parts having different diameters according to another embodiment of the invention, wherein (a) illustrates the metal nanowire including a second wire part formed at one end and (b) illustrates the metal nanowire including second wire parts formed at both ends.

FIG. 6 illustrates wire portions of a metal nanowire having at least one bent portion according to yet still another embodiment of the invention.

FIG. 7 illustrates the metal nanowire having at least one bent portion according to yet still another embodiment of the invention.

FIG. 8 illustrates wire parts of a metal nanowire having different diameters according to yet still another embodiment of the invention.

FIG. 9 illustrates the metal nanowire having different diameters according to yet still another embodiment of the invention.

FIG. 10 to FIG. 13 schematically illustrate core-shell nanowires according to embodiments of the invention.

FIG. 14 a schematically view of a roll-to-roll continuation process for forming a core-shell nanowire according to an embodiment of the invention.

FIG. 15 is a photograph of a surface of silver nanowires according to an embodiment of the invention, taken using a scanning electron microscopy.

FIG. 16 is a photograph of silver nanowires having a plurality of wire parts having different diameters according to an embodiment of the invention, taken using a scanning electron microscopy.

FIG. 17 and FIG. 18 are photographs of silver nanowires including a plurality of wire portions having at least one bent portion according to an embodiment of the invention, taken using a transmission electron microscopy.

FIG. 19 is a photograph of silver nanowires not including a plurality of wire portions and not having at least one bent portion as a comparative example, taken using a transmission electron microscopy.

FIG. 20 is graphs of transmittances, wherein (a) of FIG. 20 is a graph of a transmittance of a transparent substrate including silver nanowires according to each of Embodiments 11 to 15, and (b) of FIG. 20 is a graph of a transmittance of a transparent substrate including silver nanowires according to each of Embodiments 16 to 20.

FIG. 21 is graphs of hazes, wherein (a) of FIG. 21 is a graph of a haze of a transparent substrate including silver nanowires according to each of Embodiments 11 to 15, and (b) of FIG. 21 is a graph of a haze of a transparent substrate including silver nanowires according to each of Embodiments 16 to 20.

FIG. 22 and FIG. 23 are scanning electron microscopy photographs of core-shell nanowires according to Embodiments 23 to 27, wherein (a) of FIG. 22 corresponds to Embodiment 23, (b) of FIG. 22 corresponds to Embodiment 24, (c) of FIG. 23 corresponds to Embodiment 25, (a) of FIG. 23 corresponds to Embodiment 26, and (b) of FIG. 23 corresponds to Embodiment 27.

FIG. 24 is a photograph for illustrating that a zinc oxide is selectively coated on a nanowire formed on a core-shell nanowire substrate, according to Embodiment 25.

FIG. 25 is a graph of sheet resistances of each of Embodiments of Comparative Examples.

FIG. 26 is X-ray diffraction peaks of the core-shell nanowires according to Embodiments, wherein (a) of FIG. 26 corresponds to Embodiment 23, (b) of FIG. 26 corresponds to Embodiment 24, and (c) of FIG. 26 corresponds to Embodiment 27.

FIG. 27 to FIG. 29 are graphs of light transmittances of Embodiment 23 to Embodiment 27, wherein (a) of FIG. 27 corresponds to Embodiment 23, (b) of FIG. 27 corresponds to Embodiment 24, (a) of FIG. 28 corresponds to Embodiment 25, (b) of FIG. 28 corresponds to Embodiment 26, and 29 corresponds to Embodiment 27.

FIG. 30 to FIG. 32 are graphs of hazes of Embodiment 23 to Embodiment 27, wherein (a) of FIG. 30 corresponds to Embodiment 23, (b) of FIG. 30 corresponds to Embodiment 24, (a) of FIG. 31 corresponds to Embodiment 25, (b) of FIG. 31 corresponds to Embodiment 26, and FIG. 32 corresponds to Embodiment 27.

FIG. 33 is a graph of a photoluminescence (PL) according to each of Embodiments 23 to 25, wherein (a) of FIG. 33 corresponds to Embodiment 23, (b) of FIG. 33 corresponds to Embodiment 24, (c) of FIG. 33 corresponds to Embodiment 25.

FIG. 34 is a graph of a sheet resistance with respect to time, according to each of Embodiment 23 to Embodiment 27.

FIG. 35 and FIG. 36 are scanning electron microscopy photographs of core-shell nanowires according to Embodiments 28 to 32, wherein (a) of FIG. 35 corresponds to Embodiment 28, (b) of FIG. 35 corresponds to Embodiment 29, (c) of FIG. 35 corresponds to Embodiment 30, (a) of FIG. 36 corresponds to Embodiment 31, and (b) of FIG. 36 corresponds to Embodiment 32.

FIG. 37 is a photograph for illustrating that a zinc oxide is selectively coated on a nanowire formed on a core-shell nanowire substrate.

FIG. 38 is a graph of sheet resistances of each of Embodiments of Comparative Examples.

FIG. 39 is X-ray diffraction peaks of the core-shell nanowires according to Embodiments, wherein (a) of FIG. 39 corresponds to Embodiment 28, (b) of FIG. 39 corresponds to Embodiment 29, and (c) of FIG. 39 corresponds to Embodiment 32.

FIG. 40 to FIG. 42 are graphs of hazes of Embodiment 28 to Embodiment 32, wherein (a) of FIG. 40 corresponds to Embodiment 28, (b) of FIG. 40 corresponds to Embodiment 29, (a) of FIG. 41 corresponds to Embodiment 30, (b) of FIG. 41 corresponds to Embodiment 31, and FIG. 42 corresponds to Embodiment 32.

FIG. 43 to FIG. 45 are graphs of light transmittances of Embodiment 28 to Embodiment 32, wherein (a) of FIG. 43 corresponds to Embodiment 28, (b) of FIG. 43 corresponds to Embodiment 29, (a) of FIG. 44 corresponds to Embodiment 30, (b) of FIG. 44 corresponds to Embodiment 31, and FIG. 45 corresponds to Embodiment 32.

FIG. 46 is a graph of a photoluminescence (PL) according to Embodiments 28, 29, and 32, wherein (a) of FIG. 46 corresponds to Embodiment 28, (b) of FIG. 46 corresponds to Embodiment 29, (c) of FIG. 46 corresponds to Embodiment 32.

FIG. 47 is a graph of a sheet resistance with respect to time, according to each of Embodiment 28 to Embodiment 32.

The invention claimed is:

1. A core-shell nanowire, comprising: a nanowire core having a plurality of faces; and a metal-compound shell formed on each face of the nanowire core, wherein, when the core-shell nanowire is coated on a transparent substrate to have a sheet resistance of 1~100($\Omega$/□), a haze of the transparent substrate is in a range of 5% or more at a wavelength of 550 nm, and wherein, the metal-compound shell is an aggregate of metal-compound particles having diameters in a range of 10 to 100 nm.

2. The core-shell nanowire according to claim 1, wherein the metal-compound shell comprises a transparent conductive metal-compound material.

3. The core-shell nanowire according to claim 1, wherein the metal-compound shell has a plurality of protruded structures when viewed in a cross-sectional view perpendicular to a length direction of the core-shell nanowire, and an area or a width of the protruded structure gradually decreases as the distance from the nanowire core increases.

4. The core-shell nanowire according to claim 1, wherein the metal-compound shell has a shape of a plurality of polygons when viewed in a cross-sectional view perpendicular to a length direction of the core-shell nanowire.

5. The core-shell nanowire according to claim 4, wherein each polygon of the metal-compound shell is a triangular shape or a trapezoid shape.

6. The core-shell nanowire according to claim 1, wherein the metal-compound shell has a stripe pattern having a plurality of portions extending a longitudinal direction of the nanowire core.

7. The core-shell nanowire according to claim 3, wherein the number of the plurality of protruded structures viewed in the cross-sectional is three to six.

8. The core-shell nanowire according to claim 4, wherein the number of the plurality of polygons viewed in the cross-sectional is three to six.

9. The core-shell nanowire according to claim 6, wherein the number of the plurality of portions constituting the stripe pattern is three to six.

10. The core-shell nanowire according to claim 4, wherein, when a side of each polygon adjacent to the nanowire core is a bottom side of the polygon, the bottom side of the polygon has a length (d) of 40 nm to 200 nm and a height (c) of 10 nm to 200 nm.

11. The core-shell nanowire according to claim 1, wherein the core-shell nanowire has a length (a) of in a range of 10 μm~300 μm.

12. The core-shell nanowire according to claim 4, wherein a ratio (c/a) of the height (c) of one of the polygons to a length (a) of the core-shell nanowire is in a range of 0.00006 to 0.02.

13. The core-shell nanowire according to claim 4, wherein a ratio (f/a) of a longest diameter (f) of one of the polygons, when viewed in the cross-sectional view perpendicular to the longitudinal direction of the core-shell nanowire, to a length (a) of the core-shell nanowire is in a range of 0.0001 to 0.06.

14. The core-shell nanowire according to claim 1, wherein the haze is in a range of 20% or more at the wavelength of 550 nm.

15. The core-shell nanowire according to claim 1, wherein, when the core-shell nanowire is coated on a transparent substrate to have a sheet resistance of 1~100(Ω/☐), a light transmittance is in a range of 60 to 98% at a wavelength of 550 nm.

16. The core-shell nanowire according to claim 1, wherein the metal-compound shell includes at least one selected from a group consisting of $ZnO$, $SiO_2$, $SnO_2$, $TiO_2$, AlN, GaN, BN, InN, ZnS, CdS, ZnSe, ZnTe, CdSe, and carbon.

17. The core-shell nanowire according to claim 1, wherein the nanowire core comprises at least two wire portions, and wherein an angle (α) between an n-th wire portion and an (n+1)th wire portion connected to the n-th wire portion through an n-th bent portion satisfies an inequation of 0<α<180°.

18. The core-shell nanowire according to claim 17, wherein the angle (α) between the n-th wire portion and the (n+1)th wire portion satisfies an inequation of 130≤α≤170°.

19. The core-shell nanowire according to claim 18, further comprising: an (n+2)th wire portion connected to the (n+1)th wire portion through an (n+1)th bent portion, wherein, when a plane comprising the nth wire portion and the (n+1)th wire portion is an A plane and a plane comprising the (n+1)th wire portion and the (n+2)th wire portion is a B plane, an angle (β) of the B plane with respect to the A plane is in a range of −10° to 10°.

20. The core-shell nanowire according to claim 1, wherein the nanowire core comprises at least two wire parts, the nanowire core comprises an n-th wire part and an (n+1)th wire part connected to the n-th wire part, and a diameter of the n-th wire part is different from a diameter of the (n+1)th wire part.

21. The core-shell nanowire according to claim 1, wherein the nanowire core comprises a first wire part having a first diameter, and a second wire part having a second diameter and extended from the first wire part, and the first diameter is different from the second diameter.

22. The core-shell nanowire according to claim 21, wherein the second wire part is formed at one end or both ends of the first wire part.

23. The core-shell nanowire according to claim 21, wherein the first diameter is in a range of 50 to 100 nm, and the second diameter is in a range of 150 to 1100 nm.

24. A transparent electrode, comprising: a conductor layer comprising the core-shell nanowire of claim 1; and a transparent electrode layer formed on the conductor layer.

25. The transparent electrode according to claim 24, wherein the metal-compound shell has a plurality of protruded structures when viewed in a cross-sectional view perpendicular to a length direction of the transparent electrode, and an area or a width of the protruded structure gradually decreases as the distance from the nanowire core increases.

26. The transparent electrode according to claim 24, wherein the nanowire core comprises at least one wire portion, and wherein an angle (α) between an n-th wire portion and an (n+1)th wire portion connected to the n-th wire portion through an n-th bent portion satisfies an inequation of 130°≤α≤170°.

27. The transparent electrode according to claim 24, wherein the nanowire core comprises at least one wire part, the nanowire core comprises an n-th wire part and an (n+1)th wire part connected to the n-th wire part, and a first diameter of the n-th wire part is different from a first diameter of the (n+1)th wire part.

28. An organic light emitting diode, comprising: a transparent substrate; a first electrode provided on the transparent substrate; a second electrode facing the first electrode; and an organic light emitting layer provided between the first electrode and the second electrode, wherein the first electrode comprises a transparent electrode according to claim 24.

\* \* \* \* \*